United States Patent [19]

Kerns

[11] Patent Number: 5,196,087
[45] Date of Patent: Mar. 23, 1993

[54] METHOD FOR MAKING MULTI-LAYER PRINTED CIRCUIT BOARD

[75] Inventor: Robert Q. Kerns, Blanchester, Ohio

[73] Assignee: Multimedia Design, Inc., Blanchester, Ohio

[21] Appl. No.: 717,341

[22] Filed: Jun. 18, 1991

[51] Int. Cl.⁵ .............................. B44C 1/22; C23F 1/00
[52] U.S. Cl. ..................................... 156/626; 156/634; 156/645; 156/659.1; 156/656; 156/902
[58] Field of Search ............... 156/626, 627, 630, 634, 156/645, 655, 656, 659.1, 901, 902; 29/846, 852; 427/96, 97; 430/313, 318

[56] References Cited

U.S. PATENT DOCUMENTS

| | | | |
|---|---|---|---|
| 4,306,925 | 12/1981 | Lebow et al. | 156/150 |
| 4,325,780 | 4/1982 | Schulz | 156/659.1 |
| 4,600,663 | 7/1986 | Robertson | 428/632 |
| 4,606,788 | 8/1986 | Moran | 156/656 |
| 4,631,100 | 12/1986 | Pellegrino | 156/150 |
| 4,663,208 | 5/1987 | Ninomiya et al. | 428/138 |
| 4,707,394 | 11/1987 | Chant | 428/209 |
| 4,722,765 | 2/1988 | Ambros et al. | 156/630 |
| 4,756,795 | 7/1988 | Bakos et al. | 156/645 |
| 4,781,969 | 11/1988 | Kobayashi et al. | 428/209 |

*Primary Examiner*—William A. Powell
*Attorney, Agent, or Firm*—Frost & Jacobs

[57] ABSTRACT

A multi-layer printed circuit board is disclosed as having more layers and greater accuracy in the conductive traces of those layers than has been previously possible. Using the disclosed method, multi-layer printed circuit boards can be built having a conductive path width of 0.5 mils (0.0127 mm) and spacing between such conductive traces of 0.5 mils (0.0127 mm). The method enables multi-layer boards to be created having more than eight layers, and still maintaining the desired 0.5 mil conductive path width and spacing. The enhanced accuracy and increased number of layers is made possible by use of adjustments to customer-supplied art work based upon evaluation of test pieces made early in the procedure. By use of the disclosed method, multi-layer printed circuit boards can be built having a high density of coaxial cable equivalents and tuned wave guide equivalents. An apparatus is also disclosed which connects the coaxial cable equivalents and tuned wave guide equivalents from one multi-layer printed circuit board to a second multi-layer printed circuit board.

18 Claims, 18 Drawing Sheets

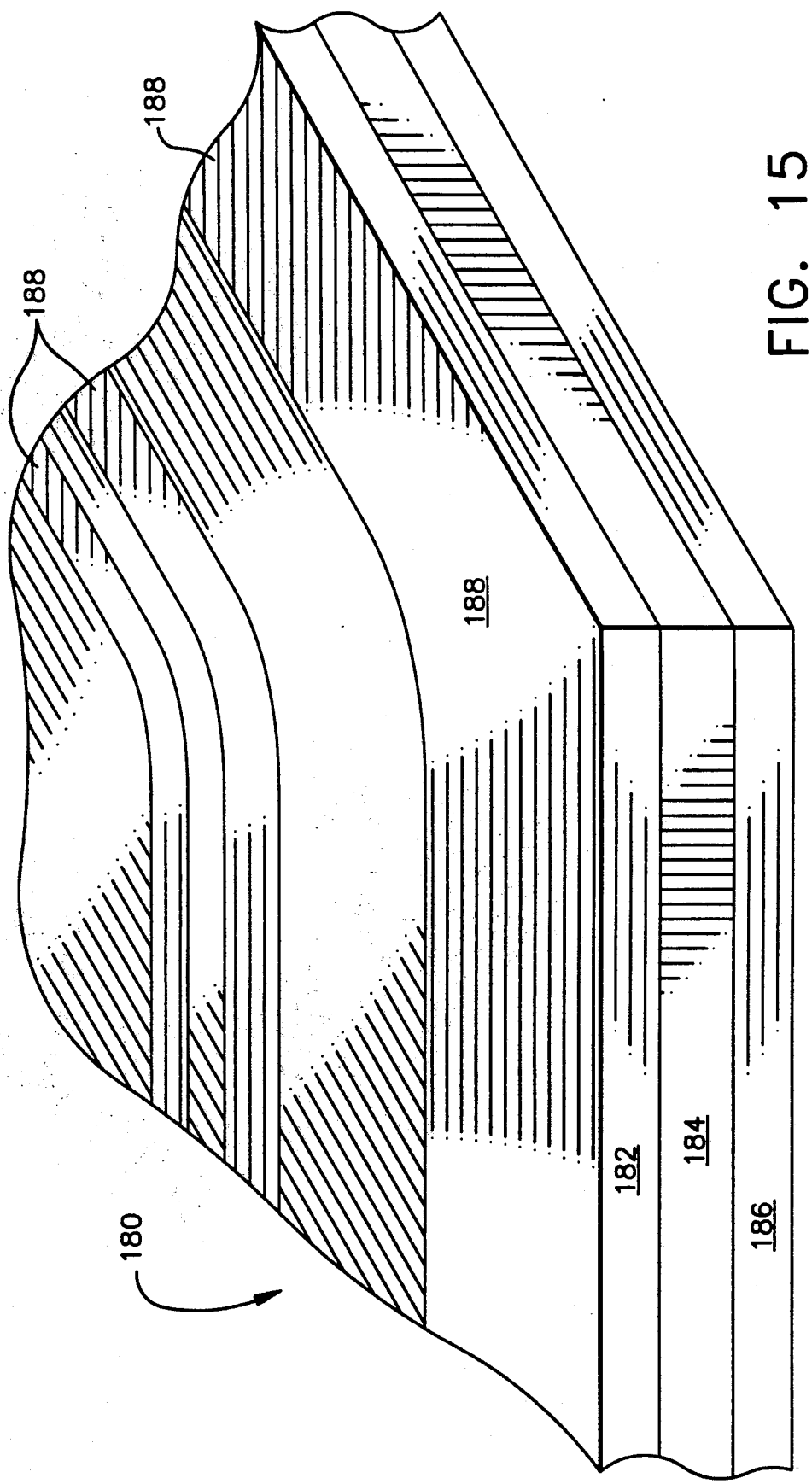

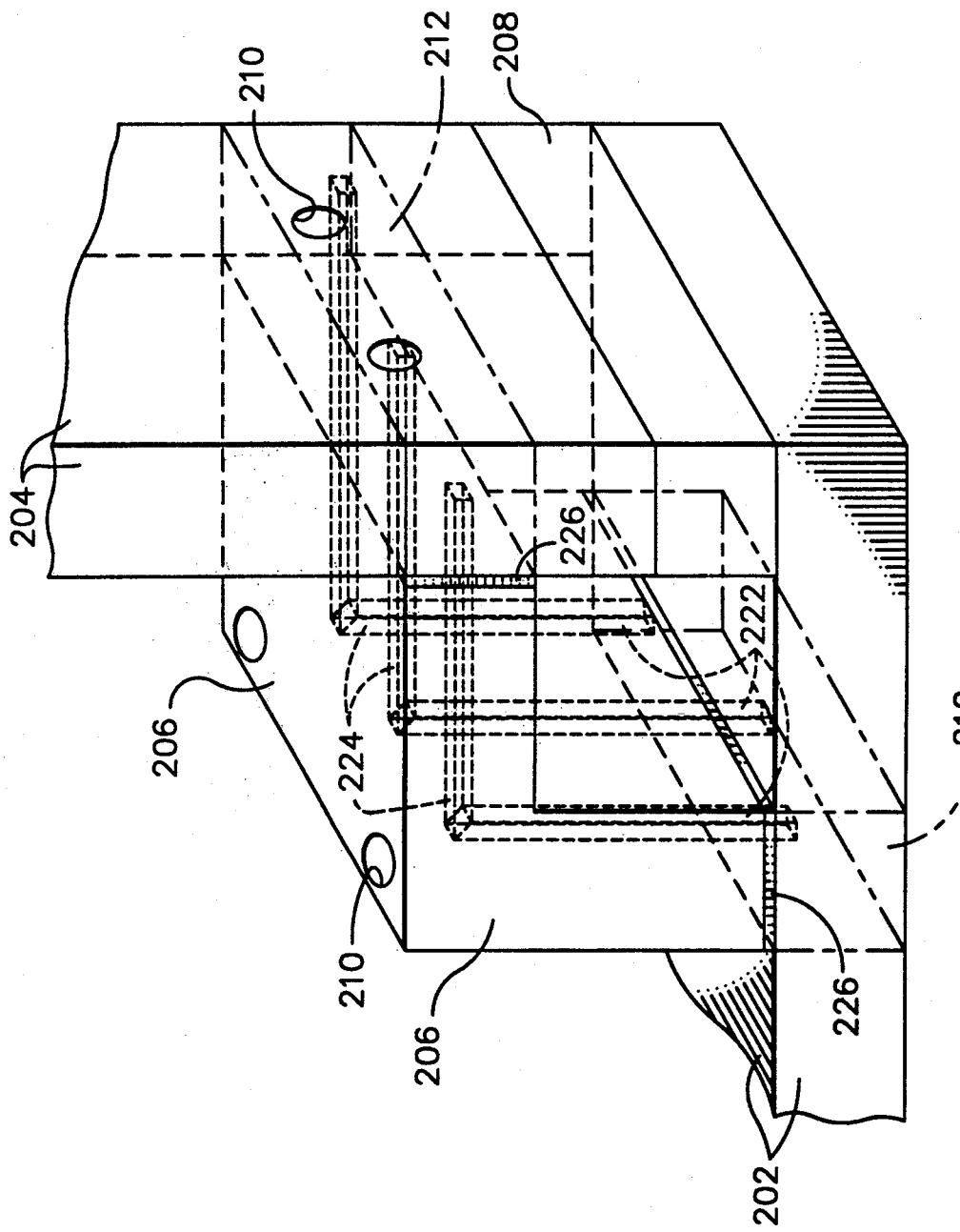

METHOD FOR MAKING MULTI-LAYER PRINTED CIRCUIT BOARD

TECHNICAL FIELD

The present invention relates generally to printed circuit boards and is particularly directed to high precision double-sided or multi-layered printed circuit boards and a method for making such boards. The invention will be specifically disclosed in connection with the creation of a multi-layered printed circuit board which can be used as a backplane and which are dimensionally and electrically stable enough to create coaxial cable equivalents or wave guide equivalents.

BACKGROUND OF THE INVENTION

It is desirable to provide high precision printed circuit boards in many situations, including both printed circuit boards that are double-sided and boards which have multiple layers. The fact that a printed circuit board has high precision circuit paths enables that board to also have a high density of those circuit paths. Such circuit path high density is normally the ultimate goal in manufacturing multiple layered printed circuit boards.

One example of a printed circuit board having high density is U.S. Pat. No. 4,306,925 by Lebow. Lebow discloses a method to make high density printed circuit boards including a step where a metallic conductive circuit pattern is formed using photolithography onto a smooth substrate. A patent by Robertson, U.S. Pat. No. 4,600,663, discloses a method for forming a microstrip line having precise width and precise edge definition onto a substrate. Robertson would also lend itself to manufacturing devices having high density.

Another method of achieving high density in printed circuit boards is to make a printed circuit board which has multiple circuit path layers. U.S. Pat. No. 4,631,100 by Pellegrino discloses a method for mass producing printed circuit boards, including those having multiple layers. Pellegrino discloses a printed circuit board blank which has a predetermined pattern of pads and interconnecting conductive pathways. To fabricate a finished circuit board of any desired circuit configuration, the printed circuit board blank is coated with a photoresist and exposed so that upon development of the photoresist, and upon being etched in accordance with the developed pattern, the interconnecting conductive pathways between pads is selectively etched away so that only those interconnects for the desired circuit pattern remain. Pellegrino does not, however, provide information as to how to achieve a higher yield of multi-layer printed circuit boards. When manufacturing printed circuit boards having six, or a maximum of eight, layers, printed circuit board manufacturers are fortunate to achieve first pass production yields of 10-20%. It is obvious that an invention that would dramatically improve the yield of multi-layer printed circuit boards would be quite useful in industry, and would dramatically cut down on the amount of wasted materials used.

Multi-layer printed circuit boards which are manufactured using current process technologies undergo the following process steps (See FIG. 2):

(1) Material ordering and receiving 40.
(2) Material storage 42.
(3) Material selection 44.
(4) Processing of inner layers 46.
(5) Lamination 48.
(6) Processing of outer layers 50.
(7) Final quality control 52.

The use of this seven-step method is well known in the art, and produces about a 10% yield in the first pass of manufacturing. Multi-layer printed circuit boards of up to eight layers are made using current process technologies to an accuracy of 2 mils (0.0508 mm) for line thickness and line spacing. This 2 mil accuracy is the best accuracy that is being achieved using the current process technologies. Multi-layer printed circuit boards which have greater than eight layers can be made using current process technologies only to a much coarser accuracy, such as 8 mils for line thickness and line spacing.

The reason 2 mil accuracy is the best that it is currently being achieved is mostly due to "drift." During the lamination process step of manufacturing a multi-layer printed circuit board, the fiberglass which makes up the major portion of the substrate of each of the layers has a tendency to drift in the direction of its grain. Because of this drift, the maximum number of multiple layers currently being produced with a 2 mil accuracy is eight layers. The greater the number of layers, the more difficult it is to control the registration points of each of the layers with respect to the other layers. Since the registration points are so difficult to line up, the effect is to limit the inaccuracy which would occur when attempting to use smaller line sizes and line spacings than 2 mils.

Double-layer printed circuit boards which were manufactured using current process technologies undergo similar process steps as compared to the processing of multi-layer printed circuit boards, as follows (See FIG. 4):

(1) Material ordering and receiving 80.
(2) Material storage 82.
(3) Material selection 84.
(4) Processing of double-sided board 86.
(5) Final quality control 88.

Using current process technologies, double-sided printed circuit boards also suffer somewhat to drift. As a result, such printed circuit boards are currently being produced with a 2 mil accuracy, similar to that being produced in multi-layer printed circuit boards.

With the limitations of the current process technologies, it would be impossible to achieve the fine accuracy required to manufacture multi-layer printed circuit boards that would be precise enough to be formed into coaxial cable equivalents or tuned wave guide equivalents that are built right into the printed circuit boards themselves. In order to make a high performance system having the above capabilities, very tight controlling impedances must be maintained. To achieve these very tight controlled impedances, the necessary method must include the following capabilities:

(1) Maintaining a distance between copper layers in the board with no more than a +/−0.0015" (0.0381 mm) variance between board layers.
(2) Maintaining copper trace stability to +/−0.0005" (0.0127 mm) of a specified line width.
(3) Maintaining an outer dimensional stability of +/−0.010" (0.254 mm) over a 17" (431.8 mm) span.
(4) Maintaining a plating tolerance of +/−0.000001" (0.0000254 mm) from a specified thickness on the sub-tracks.

(5) Computing a shrink correction factor for each lot of substrates so that each of the completed boards all meet the final dimensional tolerances.

(6) Maintaining a dielectric constant of 3.2 or lower in final constructed form for the final laminated board.

(7) Creation of printed wiring boards which are dimensionally stable to 150° C. and structurally stable to 245° C.

A multi-layer printed circuit board that is manufactured to the above tolerances can be used as a backplane in a system which requires the equivalent of high density coaxial cable connections between the various elements of the system. In other words, such a printed circuit board would be dimensionally and electrically stable enough to create coaxial cable equivalents or tuned wave guide equivalents, and would also have a high enough density to allow placement of at least 100 tuned wave guides per inch. Such multi-layer printed circuit boards are not capable of being produced under the current process technologies.

SUMMARY OF THE INVENTION

Accordingly, it is a primary object of the present invention to provide systems with the equivalent of high density coaxial cable connections between the various elements in the system.

It is another object of the present invention to provide systems which have the equivalent of tuned wave guides using multi-layer printed circuit board technology.

It is yet another object of the present invention to provide a two-times to five-times increase in the precision of the finished multi-layer printed circuit board product over the current state-of-the-art product manufactured today.

Yet another object of the present invention is to provide a two-times to three-times yield increase in the manufacturing process for high precision printed circuit boards.

A still further object of the present invention is to provide a means by which the natural characteristics of the various materials can be consistently characterized to allow consistent behavior at the printed circuit board manufacturing line.

A yet further object of the present invention is to provide a means by which realtime manufacturing feedback controls may be implemented to increase overall precision and yield of high precision printed circuit boards.

Still another object of the present invention is to achieve nominal accuracy of 0.5 mils (0.0005″ which is 0.0127 mm) of conductive line thickness, and 0.5 mils line spacing, in the manufacturing of high precision multi-layer printed circuit boards.

It is still another object of the present invention to provide a printed circuit board having a greater number of layers than is feasible using current manufacturing technologies.

It is yet another object of the present invention to provide a multi-layer printed circuit board having coaxial cable equivalents and tuned wave guide equivalents included as a portion of the electrically conductive traces on the printed circuit board.

A further object of the present invention is to achieve nominal accuracy of 0.5 mils (0.0127 mm) of conductive line thickness, and 0.5 mils line spacing, in the manufacturing of high precision double-sided printed circuit boards.

A yet further object of the present invention is to provide a means for connecting coaxial cable equivalents on one printed circuit board to similar coaxial cable equivalents on a second printed circuit board.

Additional objects, advantages and other novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing and other objects, and in accordance with the purposes of the present invention as described herein, an improved method of manufacturing high precision printed circuit boards is provided so that the final product can achieve the equivalent of high density coaxial cables and tuned wave guides using multi-layer printed circuit boards. The method includes the use of automatic control systems for sensing and controlling the drift in the substrate material of each of the layers of the multi-layer printed circuit board during the manufacturing process. Using such automatic control systems, a method also is provided for manufacturing multi-layer printed circuit boards having many more than eight layers of substrate material.

In accordance with another aspect of the invention, a method is provided which includes a material short-term storage step wherein the incoming material is placed in a standard holding area for at least 48 hours to allow the material to stabilize at the current storage temperature and humidity conditions.

In accordance with a further aspect of the invention, a method is provided which includes a material grading step wherein certain measurements are taken of the incoming material in order to determine the X and Y axis drift of the material, the Z axis shift of the material, and the X, Y and Z quiver of the material. This information is used to compute correction factors that are required in the imaging and etching systems prior to the creation of the precision multi-layer printed circuit boards.

In accordance with a still further aspect of the invention, a method is provided which includes a material long-term storage step wherein the pre-graded material is stored under constant temperature and humidity conditions to insure that the material remains stable for as long as possible.

According to a further aspect of the invention, a material selection step of the provided manufacturing method includes a sub-step wherein the material grading data is used in order to choose the proper substrate material of each of the layers which form the final multi-layer printed circuit board.

In yet another aspect of the invention, in the artwork computation and adjustments step of the provided manufacturing method, the material grading factors of a batch of material are used to make changes in the customer standard art work data. This method step provides the required correction factors for the particular batch of material which the processing equipment will need so that the finished product to be a proper reflection of the original customer art work data.

In still another aspect of the invention, in the processing of inner layers step of the provided manufacturing method, each base material layer is individually drilled with tooling and registration holes, then the base material is masked over the areas of the material which will not have copper traces. Copper is then plated onto this material to form the copper traces and to build up the copper thickness in the hole walls, and, finally, unwanted copper is stripped and etched from the laminate material. The material layers are stacked up into three-layer laminated printed circuit boards. These three-layer boards are then milled and drilled according to the customer's requirements, plated with conductive copper, back-filled with pre-preg (uncured resin mixed with glass fibers) or raw resin which is then cured in the laminating press, then etched to remove any unwanted top copper plating.

In yet another aspect of the invention, in the inner layer product evaluation step of the provided manufacturing method, a three dimensional X-ray test is performed to insure that the current correction factors are still valid. This X-ray test is performed for each of the three-layer boards of the multi-layer printed circuit board before the final lamination step takes place.

In accordance with a still further aspect of the invention, a method is provided which includes a lamination step wherein all of the layers of the final printed circuit board are stacked up in the proper order and then laminated together to form one assembly. The lamination procedure may take place in more than one step. If necessary to meet customer requirements, individual three-layer stacks can be laminated together in sub-steps so that other processing steps can take place before final stack-up and lamination. Other processing steps in such sub-steps include milling and drilling, plating, back-filling, curing, and etching of each sub-step group of three-layer boards. The correction factors which have been computed for the particular batch of material involved are used in order to increase the percentage of parts which will meet the final specifications.

In still another aspect of the invention, the processing of outer layers step of the provided manufacturing method includes drilling of the laminated material according to the desired hole pattern requested by the customer, plating of the interior walls of the holes with conductive copper, masking the areas which will not have copper traces in the final laminated product, a pattern plating step wherein the copper traces are formed and copper thicknesses built up in the hole walls, and a final strip and etch step wherein unwanted copper is removed from the top and bottom layers of the laminated board.

In a still further aspect of the invention, in the outer layer product evaluation step of the provided manufacturing method, another three dimensional X-ray test is performed to insure that the current correction factors are still valid for the entire assembled printed circuit board.

In yet a still further aspect of the invention, a final quality control step of the provided manufacturing method includes electrical and visual tests to insure that the laminated printed circuit board has come through all the processing steps correctly.

In accordance with a further aspect of the invention, an improved multi-layer printed circuit board is provided such that at least twenty-seven layers may be accurately laminated together into one final printed circuit board product.

According to another aspect of the invention, a multi-layer printed circuit board is provided having high-density coaxial cable equivalents and tuned wave guide equivalents.

In accordance with yet another aspect of the invention, a right-angle conductive shell is provided which allows the connection of coaxial cable equivalents that reside upon one multi-layer printed circuit board to a similar set of coaxial cable equivalents which reside on a second multi-layer printed circuit board. The right-angle conductive shell can contain either round or square coaxial cable equivalents, or round or square tuned wave guide equivalents.

In accordance with the purposes of the present invention as described herein, an improved method of manufacturing high precision double-sided printed circuit boards is provided. The method includes the use of automatic control systems for sensing and controlling the drift in the substrate material of the double-sided printed circuit board during the manufacturing process.

Still other objects of the present invention will become apparent to those skilled in this art from the following description wherein there is shown and described a preferred embodiment of this invention, simply by way of illustration, of one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description serve to explain the principles of the invention. In the drawings:

FIG. 11 is taken at a point in the laminated printed circuit board where there are no vertical conductive runs between the various layers;

FIGS. 14a and 14b are isometric views of round horizontal coaxial cable equivalents, wherein FIG. 14a shows some of the hidden lines of the inner and outer round conductors of the horizontal coaxial cable equivalent, and FIG. 14b shows the round horizontal coaxial cable equivalent as it would be seen from the end of the printed circuit board;

FIG. 15 is a partial perspective view of a laminated, double-sided printed circuit board manufactured in accordance with the method of the present invention;

FIG. 18 is an isometric view of a flexible coaxial equivalent connector, similar to FIG. 16, however showing some of the inner details of the flexible connector.

DETAILED DESCRIPTION OF THE INVENTION

Figure 1:
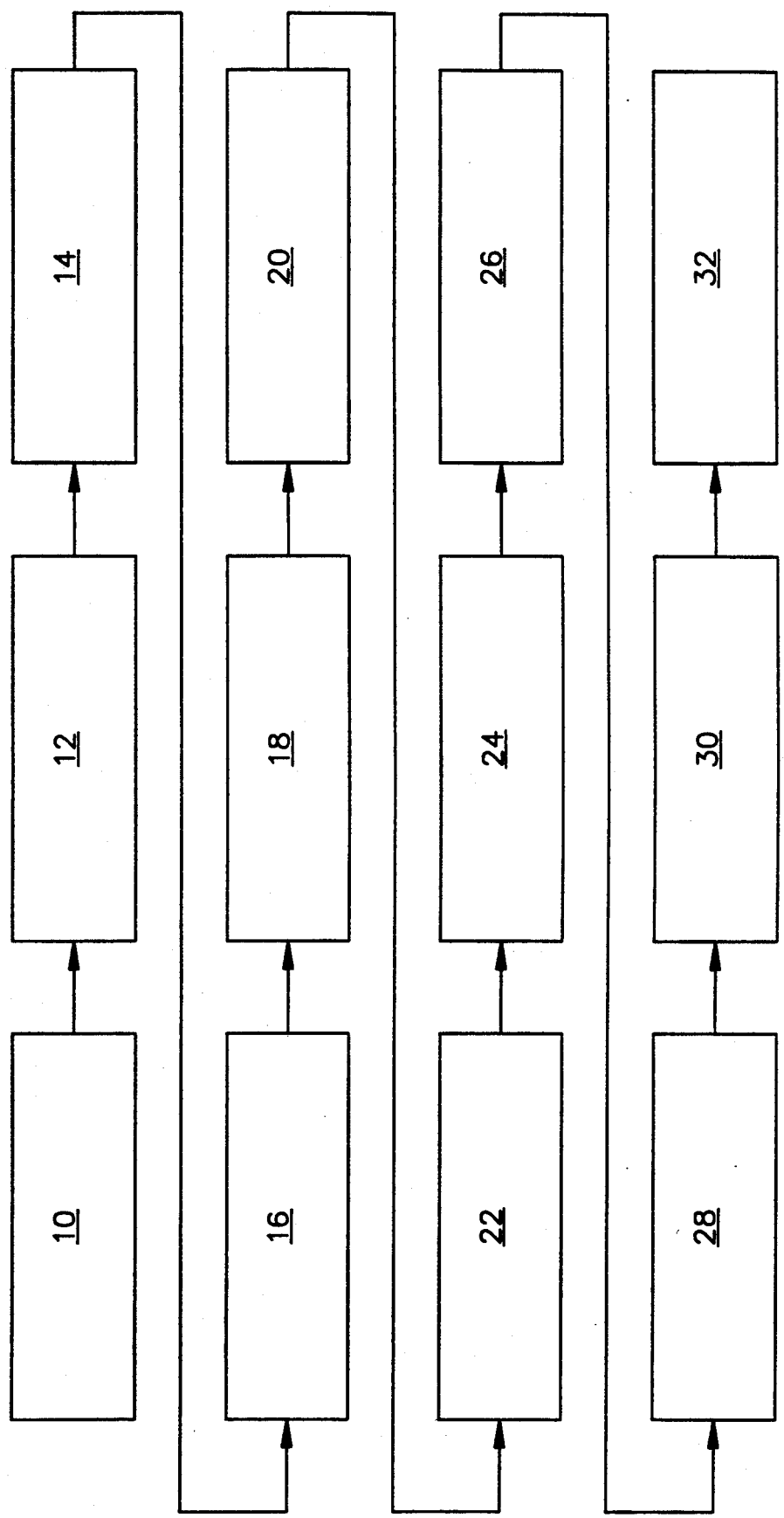
FIG. 1 is a block diagram illustrating in flow chart form the method for making a high precision multi-layer printed circuit board in accordance with the present invention.
Figure 2:
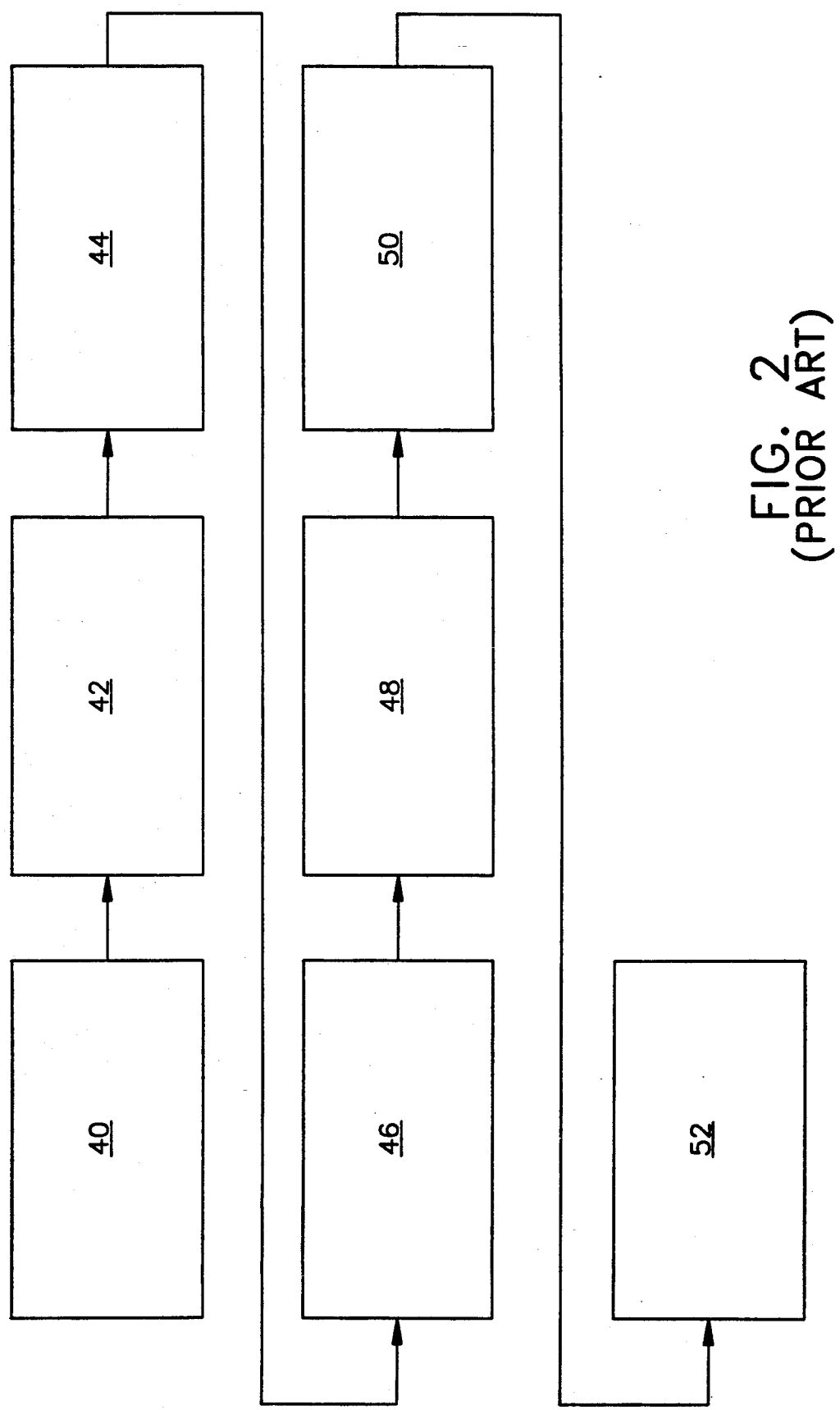
FIG. 2 is a block diagram illustrating a conventional method for making a multi-layer printed circuit board known in the prior art.

Referring now to the drawings in detail, wherein like numerals indicate the same elements throughout the views, FIG. 1 shows a block diagram of the present method for making a high precision multi-layer printed circuit board. The method is broadly broken down into twelve process steps, which are as follows:

(1) Material Ordering and Receiving 10.
(2) Material Short-term storage 12.
(3) Material Grading 14.
(4) Material Long-Term Storage 16.
(5) Material Selection 18.
(6) Artwork Computations and Adjustments 20.
(7) Processing of Inner Layers 22.
(8) Inner Layer Product Evaluation 24.
(9) Lamination of Board 26.
(10) Processing of Outer Layers 28.
(11) Outer Layer Product Evaluation 30.
(12) Final Quality Control 32.

MATERIAL ORDERING AND RECEIVING STEP 10: The raw materials are ordered according to the basic customer needs and current inventory stocking needs. Particular attention is paid to what batch and/or lot numbers the raw materials belongs to. When the materials are received, they are grouped according to their specific batch and/or lot numbers.

MATERIAL SHORT-TERM STORAGE STEP 12: The incoming material is received into a standard holding area for at least 48 hours to allow the material to come to the current storage temperature and humidity conditions.

MATERIAL GRADING STEP 14: Correct material selection and grading is paramount to the correct functioning of all further high precision printed circuit board processing steps. In standard multi-layer printed circuit production, incoming material is merely logged for manufacturer type and added to the existing inventory of raw material. One of the KEY high precision printed circuit board processing steps is the addition of the precision raw material grading process. For each lot of incoming material, the manufacturer's resin batch number and manufacturing lot numbers must be recorded. If the incoming material has batch or lot numbers not currently recorded in the manufacturing system, enough material for six 12-layer boards 12" by 18" must be set aside for the raw material grading process.

Figure 5:
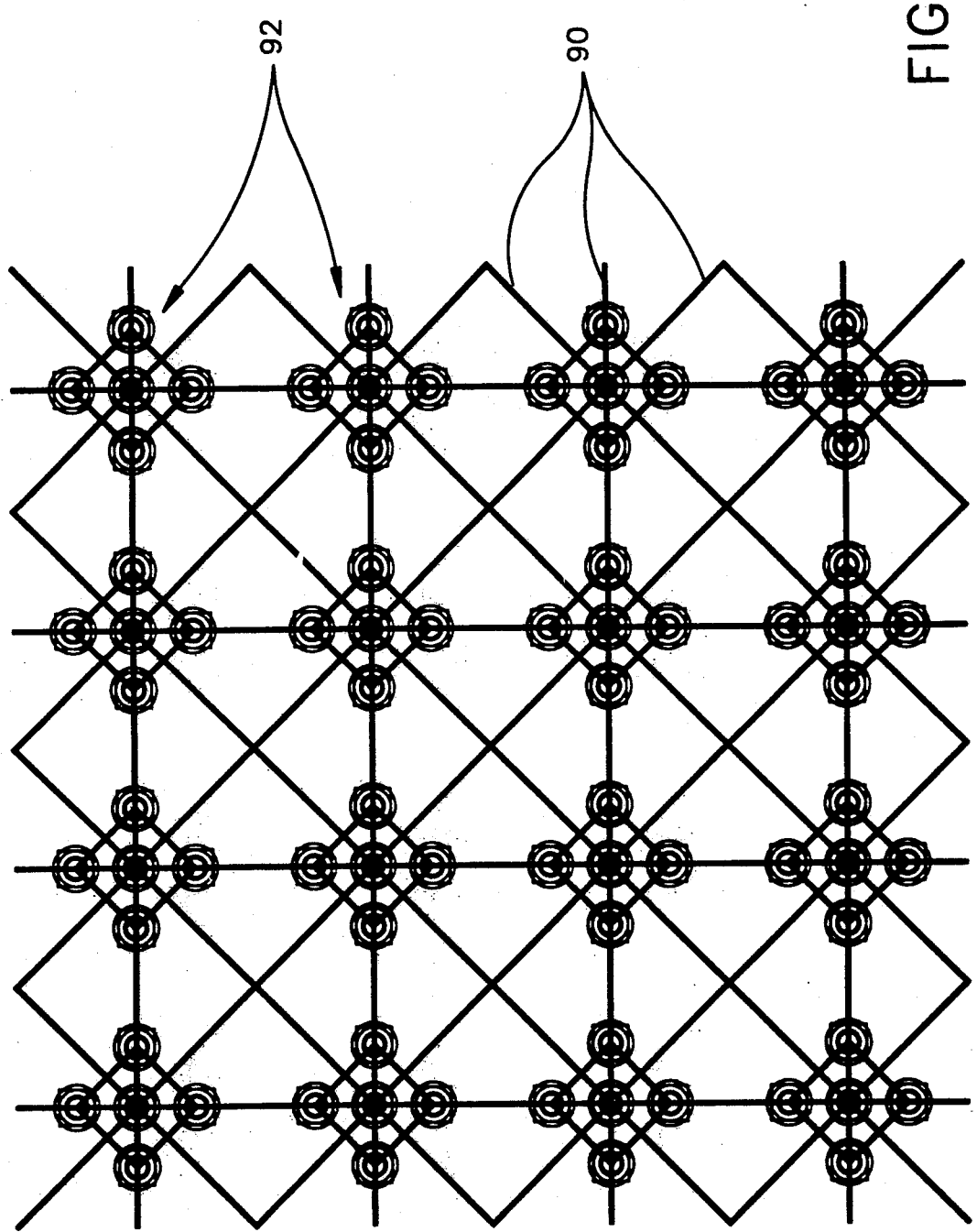
FIG. 5 depicts the standard test pattern template, which is applied to test parts for use in etching system measurements.

The material grading process involves the following steps:

(1) Create three double-sided boards using material FROM the SAME resin BATCH NUMBER and the SAME manufacturing LOT NUMBER. These boards shall use the standard image stepped across each layer. The standard image is defined in FIG. 5. The test pattern conductive paths 90 and 92 of this standard image are particularly useful in detecting shifts in the conductive copper due to later processing of the boards. The specific test pattern, designated as 92, is extremely useful in detecting Z-axis errors (i.e., through the thickness of the multi-layer board). All processing of these boards shall be according to the manufacturer established guidelines for the particular material, which is known in the art. Other sections of this document give detailed examples for particular materials.

(2) Create three dimensional X-ray images of the three double sided boards. The three dimensional images of the boards are made using an industrial version of the CAT scanner. Such a CAT scanner can be obtained from the General Electric Company. The resolution of the scanner employed is preferably 0.000001" (0.0000254 mm). The information gathered will be used to compute the following information:

X and Y axis Drift.
Z axis Drift, also referred to as Z axis "shift".
X, Y and Z axis Drift, also referred to as X, Y, and Z axis "quiver".

(3) The information gathered from the above two steps is used to compute any basic correction factors for the imaging and etching systems prior to creating the precision multi-layer test boards. The primary information revealed in this step determines what basic set of correction factors should be applied to the artwork to account for imaging and etching system variations. The above three dimensional X-ray images are digitized and compared to a digitized set of ideal images. The differences are determined and used to create the above basic correction factors.

(4) Create three multi-layer boards using material FROM the SAME resin BATCH NUMBER AND THE SAME manufacturing LOT NUMBER. These boards shall be 12-layer boards using the standard image stepped and repeated to a standard panel size (14" (355.6 mm)×18" (457.2 mm)) across each layer. The standard image is defined in FIG. 5. All processing of these boards shall be according to the manufacturer established guidelines for the particular material. Other sections of this document give detailed examples for particular materials.

(5) Create three dimensional X-ray images of the three multi-layer boards. The three dimensional images of the boards are made using an industrial version of the CAT scanner. The resolution of the scanner employed is preferably 0.000001" (0.0000254 mm). The information gathered will be used to compute the following information:

X and Y axis Drift.
Z axis Drift (shift).
X, Y and Z axis (Drift (quiver).

(6) Measure the X and Y axis Drift. Drift is defined to be the amount that the copper pattern has shifted from the ideal position as defined by the reference image. Variables which affect X and Y axis Drift are:
Resin batch number.
Resin-substrate manufacturing lot number.
Resin/substrate ration.
Resin/solvent ratio.
Substrate base direction. (WARNING: all substrates must have the same base direction or the X, Y measurements will be invalid).
Lamination variables:
 (a) Heating curve.
 (b) Pressure curve.
 (c) Lamination duration.
 (d) Cooling Curve.
 (e) Pressure Release Curve.

(7) Measure the Z axis Drift (shift). Z axis shift is defined to be the amount that the copper pattern has shifted in the vertical Plane from it's normalized position of against the substrate. Variables which affect Z axis shift are:
Resin/Solvent Ration.
Substrate construction pattern.
Lamination variables:
 (a) Heating curve.
 (b) Pressure curve.
 (c) Lamination duration.
 (d) Cooling Curve.
 (e) Pressure Release Curve.

(8) Measure the x, y and z axis Drift. X, Y and Z Drift (quiver)is defined to be the amount the copper pattern alters it's thickness or width as compared to the reference image. Variables which affect quiver are:
Etching Variables.
 (a) Solvent Spray Pattern.
 (b) Solvent Strength.
 (c) Etching time duration.
Lamination variables:
 (a) Heating curve.
 (b) Pressure curve.
 (c) Lamination duration.
 (d) Cooling Curve.
 (e) Pressure Release Curve.

(9) Compute the correction factors which should be applied to the customer's printed circuit artwork digitized data to account for the variations encountered in the test pieces. For example, the corrections which could be applied to any given artwork include:
 (a) Line width, to control the line impedance based on the final thickness and actual measured dielectric constants for a given batch of raw materials.
 (b) Line width variations along the path to account for traceable variations in the etching system.
 (c) Line width variations along the path to account for traceable variations in the lamination process.
 (d) Stretching or shrinking the artwork to account for major X or Y axis shifting of the substrate during the lamination portion of the process.
 (e) Altering the drilling machine instructions to suit the final actual pattern to be drilled.

After the initial artwork correction factors have been computed, the material is then able to be put into the production inventory.

MATERIAL LONG-TERM STORAGE STEP 16: The pre-graded material is stored under constant temperature and humidity conditions to ensure that the material remains stable for as long as possible. If material is retained in storage longer than the standards acceptable to each material type as determined by the manufacturer of the material, then the grading process must be repeated to ensure that the correction factors agree with current state of the raw material.

MATERIAL SELECTION STEP 18: In high precision printed circuit board Multi-layer printed circuit production, material is often selected based on the following characteristics:
Material Type.
Material Thickness.
Copper Thickness.
Total Board Thickness.
Material Grading Data; The material grading factors which must be matched for a processing run are:
 (a) X and Y axis Drift.
 (b) Z axis Drift (shift).
 (c) X, Y and Z axis Drift (quiver).

ARTWORK COMPUTATION AND ADJUSTMENTS STEP 20: In the series of steps represented by block 20, the material grading factors are used to make changes in the customer standard artwork data to provide the required correction factors which this batch of material and processing equipment will need for the finished product to be an accurate reflection of the original customer artwork data.

PROCESSING OF INNER LAYERS STEP 22

Process Steps In Overview. The steps involved in the process are:
(1) Material Drilling.
(2) Mask Plating Pattern.
(3) Pattern Plating.
(4) Strip and Etch.
(5) Intermediate Stack-up, Lamination and Milling.

Material Drilling: The base material is drilled with tooling and registration holes which preferably fall outside the customer defined working area. These tooling and registration holes are used for process handling and artwork registration during the processing of the material.

The base material is also referred to in the art as the printed circuit board laminate material. Such laminate material is typically available in either single-sided or double-sided configurations. A single-sided printed circuit laminate has a surface of copper on one side (see FIG. 6, element 96). A double-sided printed circuit laminate has a copper surface on both sides (see FIG. 6, element 98).

In the preferred embodiment, the printed-circuit laminate consists of a sheet of cured epoxy resin mixed with fiberglass fibers. The laminate is formulated with tetrafunctional epoxy to enhance thermal and chemical resistance properties without the use of Novolac while maintaining the process availability of traditional FR-4 systems. The preferred embodiment uses the formulation available under the trade name TECHNOPLY 4003 TM, which is manufactured by Arlon. TECHNOPLY 4003 TM is available in several different resin content percentages, ranging from 42% resin to 75% resin. The remaining compound which is not resin consists of fiberglass.

Mask Plating Pattern: The purpose of this series of steps is to mask the areas of the customer-defined board which will NOT have copper traces to prevent copper and tin/lead plating in areas which will occur in later steps. This step is known in the art.

(1) Laminate Resist

Laminate the photoresist using hot roll laminator at 230-250° F. (110-121.1° C.). In the preferred embodiment, a dry film negative acting photoresist is used. This dry film photoresist is 1.3 mils (33.02 mm) thick and is intended for printed circuit board pattern masking. Such photoresist is available from Kodak TM under the trade name DFR-4113.

(2) Cure Resist

Let sit at room temperature for 15 Minutes.

(3) Expose Photo Resist

Expose for 3.5 minutes using an ultraviolet exposure unit. The ultraviolet exposure unit includes an ultraviolet light source, and a bed where the printed circuit board with its photoresistent laminate is placed, then a layer of film which contains the customer's art work, then a layer of glass to hold everything in registration. The ultraviolet exposure unit of the preferred embodiment is available under the trade name BTX-200, available from Kepro Inc.

(4) Post Cure Resist

Let sit at room temperature for 15 minutes.

(5) Develop Exposed Pattern

To perform this step, a dry film developer solution must be used. In the preferred embodiment, the dry film developer is a mildly caustic solution consisting primarily of sodium carbonate which is 99.7% dry bead, Soda Ash. In the preferred embodiment, the dry film developer can be that sold by Kodak TM under the trade name DFD-12G. For the developing process, it is used as a 1% solution in water.

Spray develop for 1.5 minutes.

(6) Water Spray Rinse

Dip rinse with agitation in deionized water for 2 minutes (a preferred water temperature is about 95° F. (35° C.)).

Spray rinse in deionized water for 2 minutes (water temperature=95° F. (35° C.)).

Pattern Plating. The purpose of this series of steps is to build up the copper thickness in the following areas:
Hole Walls.
Copper Traces 108.

After the copper has been built up, Tin/Lead is plated on top of the copper. This step is known in the art.

Process Steps (1) Chemically Clean Copper

A liquid acid cleaner is useful in the pattern plating clean cycle for printed circuit boards. Cleaning with liquid acid cleaner produces a mild etch and removes light oils, smuts, oxides, fingerprints, and resist residues. In a preferred embodiment, the cleaner can comprise a liquid and cleaner sold under the trade name Metex TM 9268 and is sold by MacDermid, Inc.

Metex TM 9268 cleaner solution at 90° F. (32.2° C.).

Dip panel in solution with active agitation for 30 seconds.

(2) Water Spray Rinse

Dip rinse with agitation in deionized water for 2 minutes (a preferred water temperature is about 95° F. (35° C.)).

Spray rinse in deionized water for 2 minutes (Water temperature=95° F. (35° C.)).

(3) Prep Panel

To prepare the printed circuit board, a powdered blend is used as a mild copper microetch prior to activation in the plated through hole line, or prior to innerlayer oxide processing. The blend provides excellent topography to promote excellent copper-to-copper adhesion from the plated through hole process, and laminate-to-copper adhesion from the oxide process. In the preferred embodiment, the etch used is sold under the trade name MACuPrep TM Etch G-4, manufactured by MacDermid, Inc.

MACuPrep TM Etch G-4 solution at 100° F. (37.8° C.).

Dip panel in solution with active agitation for 1 minute.

(4) Water Spray Rinse

Dip rinse with agitation in deionized water for 2 minutes water temperature=95° F. (35° C.)).

Spray rinse in deionized water for 2 minutes (water temperature=95° F. (35° C.)).

(5) Acid Treat Panel

A solution of 10% $H_2SO_4$ at 100° F. (37.8° C.) has been found to be preferred.

Dip panel in this solution with active agitation for 1 minute.

(6) Electroplate Copper

An acid copper plating process is used which produces ductile, crack-resistant, semi-bright copper electrodeposits. This process is made for plating printed circuit boards up to a current density of 50 amperes per square foot (ASF). In the preferred embodiment, the solution used is available under the trade name MACu SPEC TM 9241, which is manufactured by MacDermid, Inc.

MACu SPEC TM 9241 acid copper solution is preferably maintained at about 90° F. (32.2° C.).

Dip panel in electroplating solution with active agitation and plating for approximately 36 minutes.

(7) Water Spray Rinse

Dip rinse with agitation in deionized water for 2 minutes (water temperature=95° F. (35° C.)).

Spray rinse in deionized water for 2 minutes (water temperature=95° F. (35° C.)).

(8) Clean Copper

Fluroboric acid at 100° F. (37.8° C.).

Dip panel in solution with active agitation for 1 minute.

(9) Electroplate Tin/Lead

A solder plating solution is used for the electroplating process on printed circuit boards, which gives a silver white 60–40 tin-lead alloy over a wide range of current densities. This process can analyze and control the plating additive used to refine the grain structure, thus yielding greater consistency of operation. In the preferred embodiment the solution used is available under the trade name TARTAN ™ Sn-Pb Plating solution which is manufactured by MacDermid, Inc.

Use TARTAN Sn-Pb Plating solution at 90° F. (32.2° C.).

Dip panel in electroplating solution with active agitation and plating for 36 minutes.

(10) Water Spray Rinse

Dip rinse with agitation in deionized water for 2 minutes (water temperature=95° F. (35° C.))

Spray rinse in deionized water for 2 minutes (water temperature 95° F. (35° C.))

(11) Dry Panel

Dry panel with warm air dryer.

Strip and Etch: The purpose of this series of steps is to remove any unwanted copper from the copper layers on the laminate. This step is known in the art.

(1) Strip Resist Pattern

The photoresist must now be stripped off of the printed circuit board. A dry film stripper is used to perform this function. The dry film stripper can preferably comprise a mildly caustic solution of potassium hydroxide, which is a 90% dry flake caustic potash, such as available under the trade name DFS-12G, from Kodak ™. This dry film stripper is mixed with water to form a 1% solution for the stripping process.

Use DFS-12G resist stripper solution at 95° F. (35°).

Dip process panel in tank with agitation for 6 minutes. After processing ensure that all traces of photoresist are gone before proceeding to the next step.

(2) Water Spray Rinse

Dip rinse with agitation in deionized water for 2 minutes (water temperature=95° F. (35° C.)).

Spray rinse in deionized water for 2 minutes (water temperature=95° F. (35° C.)).

(3) Etch Panel

To etch the copper, a solution of sodium persulfate is used to selectively etch away copper but not attack the tin/lead plate in holes or circuit pattern areas. The preferable etching solution is available under the trade name SP-20G, which is manufactured by Kodak ™.

SP-20G Etching solution at 95° F. (35° C.).

Dip panel in solution with active agitation for 1 minute.

(4) Water Spray Rinse

Dip rinse with agitation in deionized water for 2 minutes (water temperature=95° F. (35° C.)).

Spray rinse in deionized water for 2 minutes (water temperature=95° F. (35° C.)).

(5) Dry Panel

Dry panel with warm air dryer.

Intermediate Stack-up, Lamination and Milling: The purpose of this step is to create three-layer boards having the proper conductive paths between top and bottom of each layer. The final multi-layer board product of the illustrated embodiment is a combination of three-layer boards, stacked up with the proper vertical and horizontal conductive paths.

Figure 6:
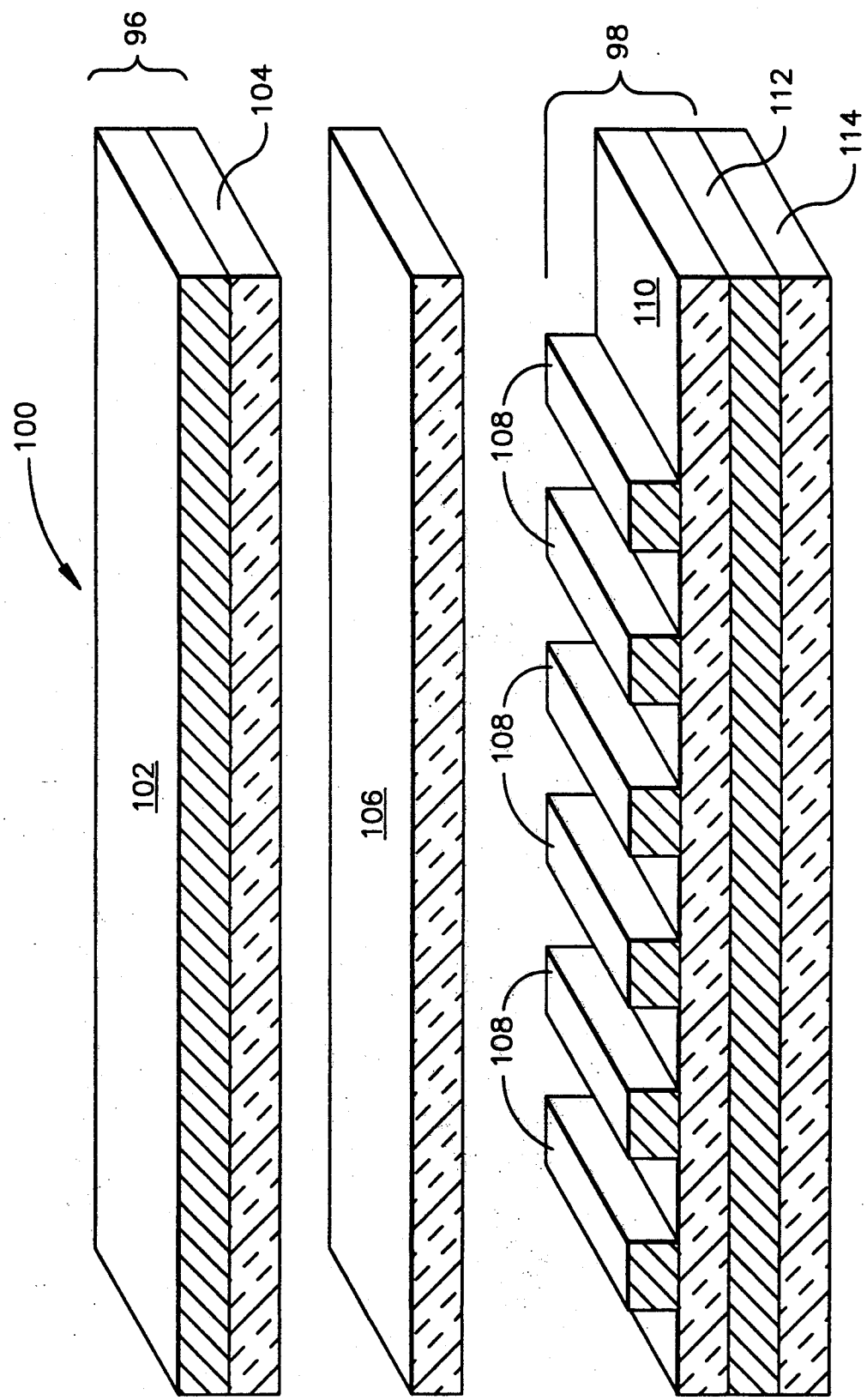
FIG. 6 is an isometric view of an exemplary stack-up of layers of insulative and conductive materials, which, once laminated, will become a three-layer printed circuit board.

(1) Create a three-layer stack-up 100 (FIG. 6).

Use a single-sided printed circuit board 96 having a layer of conductive copper 102, and a layer of insulative material 104, as the top layer of the three-layer stack 100.

Use a layer of "pre-preg" material 106, which is uncured printed circuit board laminate material, as the middle layer of the three-layer stack 100. The pre-preg consists of uncured epoxy resin mixed with fiberglass fibers. In the preferred embodiment, the pre-preg is formulated with tetrafunctional epoxy to enhance thermal and chemical resistance properties without the use of Novolac while maintaining the process availability of traditional FR-4 systems. The preferred embodiment uses the formulation available under the trade name TECHNOPREG 4003 ™, which is manufactured by Arlon. TECHNOPREG 4003 ™ is available in several different resin content percentages, ranging from 42% resin to 75% resin. The remaining compound which is not resin consists of fiberglass.

Use a double-sided printed circuit board 98 having an already-processed grid of conductive copper circuit paths 108, a layer of insulative material 110, and a layer of conductive copper 112, along with a further layer, on the bottom, of insulative material 114, as the bottom layer of the three-layer stack 100.

Figure 7:
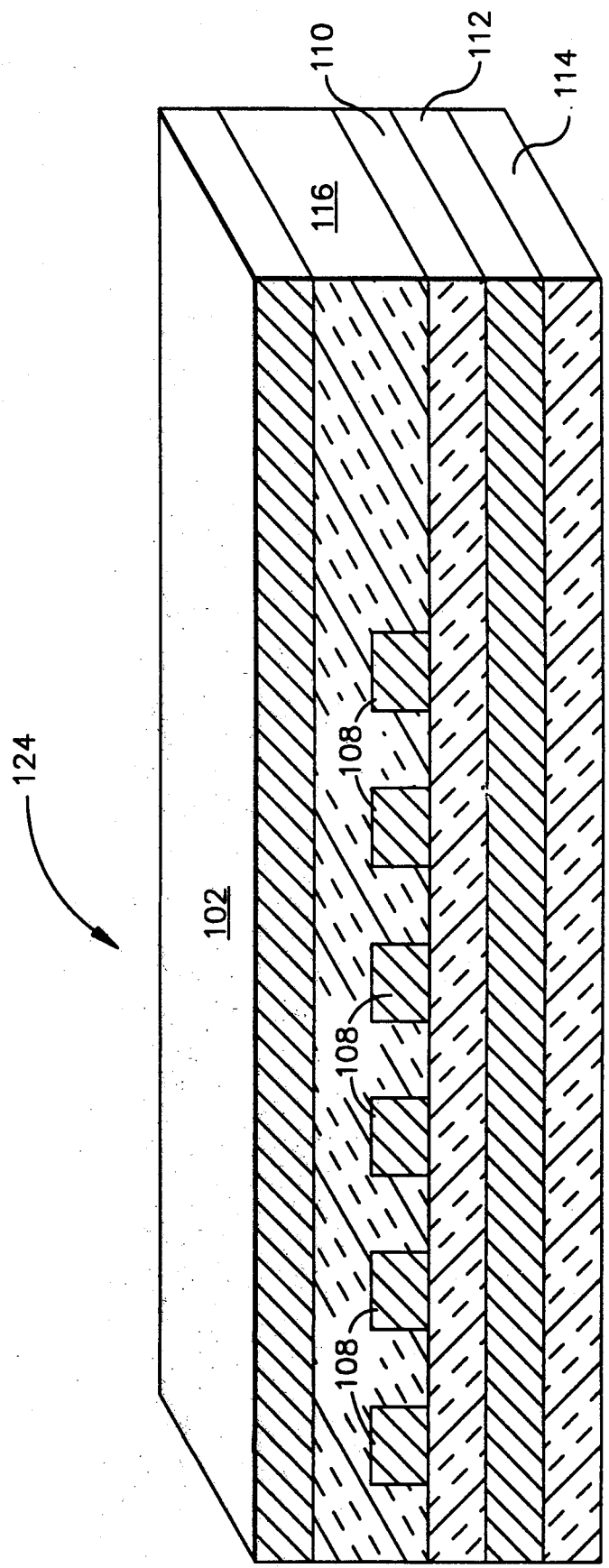
FIG. 7 is an isometric view of a three-layer printed circuit board manufactured according to the method of the present invention.

(2) Laminate the three-layer stack, creating a laminated three-layer printed circuit board 124 (FIG. 7) having a conductive copper top layer 102, and an insulative bottom layer 114. The insulative layers 104 and 106 melt together to become one insulative layer 116.

Figure 8:
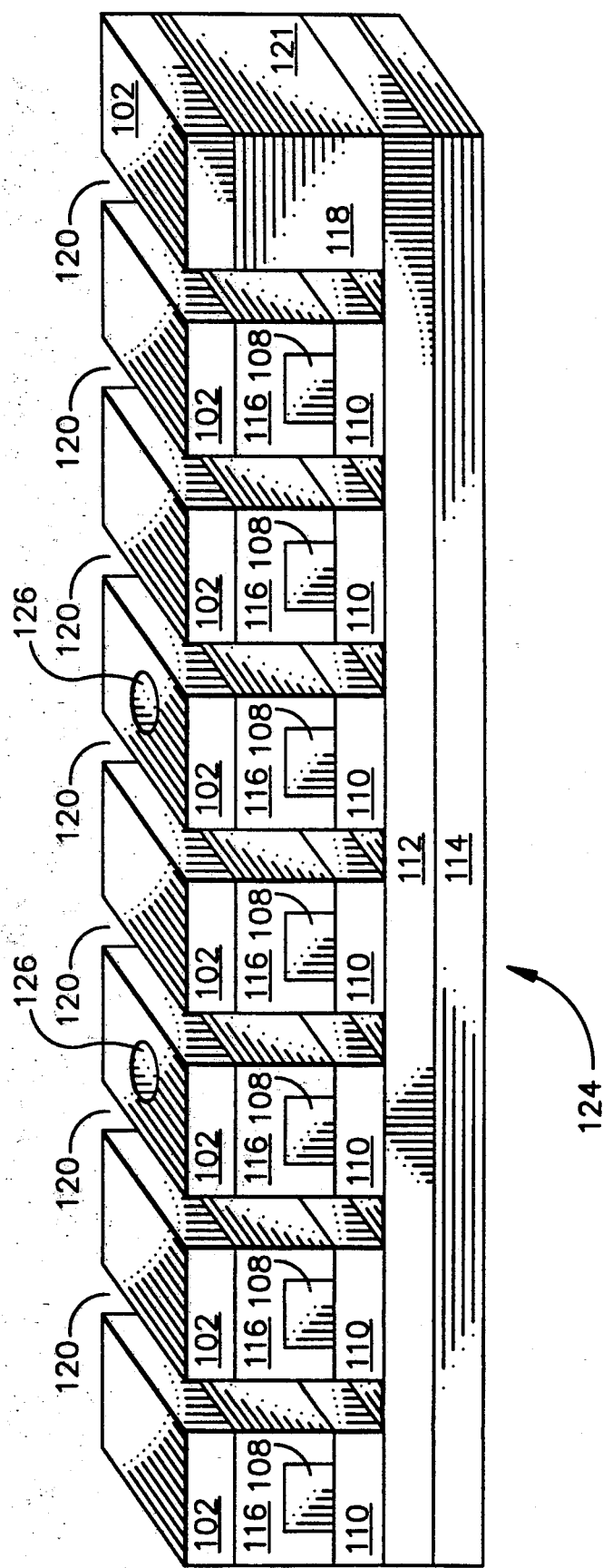
FIG. 8 is an isometric view of a laminated three-layer printed circuit board manufactured in accordance with the method of the present invention, wherein vertical slots have been milled into the upper layers of the laminated three-layer printed circuit board, and vertical holes have been drilled into the three-layer laminated printed circuit board.

(3) Mill any local vertical slots 120 to meet the customer requirements (FIG. 8). Mill any required horizontal slots as well.

(4) Drill any vertical holes 126 to meet the customer requirements (FIG. 8). Drill any required horizontal holes as well.

(5) Plate the holes and slots according to the steps of printed circuit board processing of inner layers 22. Note that vertical slots 120 are now plated with conductive copper, and help to complete an outer square portion of a coaxial cable equivalent along the circuit path of copper layer 112, vertical slot 120, copper layer 102, and a second adjacent vertical slot 120. This circuit surrounds the square insulative material 116 and the conductive path 108, thus forming a coaxial cable equivalent.

After the plating step has occurred the right-hand vertical side 121 of FIG. 8 is also plated with conductive copper. The vertical plated side 121 helps to complete a conductive square along the circuit path of copper layer 112, vertical slot 120, copper layer 102, and vertical plated side 121. This circuit surrounds the square insulative material 118, thus forming a wave guide equivalent.

(6) Back-fill the vertical slots 120 and holes 126 with either pre-preg material or raw resin. If the slots are too small to effectively use pre-preg material, then raw resin must be used. The resin is available in either powder or bead form and consists of epoxy resin without any fiberglass or other base material. There are many forms and manufacturers of this resin, which is well known in the prior art. A squeegee is used to remove any excess pre-preg material or raw resin powder from the top surface of the three-layer board.

(7) Cure the pre-preg or raw resin in the lamination press utilizing a further lamination process of the three-layer board.

(8) Perform a mask plating pattern process upon the three-layer pinted circuit board 124. The mask plating pattern consists of the following steps:

(a) Laminate Resist.
 Laminate photoresist using hot roll laminator at 230–250° F. (110–121.1° C.).

(b) Cure Resist
 Let sit at room temperature for 15 Minutes.

(c) Expose Photo Resist
 Expose for 3.5 minutes using the BTX-200 ultraviolet exposure unit.

(d) Post Cure Resist
 Let sit at room temperature for 15 minutes.

(e) Develop Exposed Pattern
 Use DFD-12G developing solution.
 Spray develop for 1.5 minutes.

(f) Water Spray Rinse
 Dip rinse with agitation in deionized water for 2 minutes (water temperature=95° F. (35° C.)).
 Spray rinse in deionized water for 2 minutes (water temperature=95° F. (35° C.)).

(9) Perform a pattern plating process upon the three-layer printed circuit board 124. The pattern plating process steps are as follows:

(a) Chemically Clean Copper
 Metex™ 9268 cleaner solution at 90° F. (32.2° C.).
 Dip panel in solution with active agitation for 30 seconds.

(b) Water Spray Rinse
 Dip rinse with agitation in deionized water for 2 minutes (water temperature=95° F. (35° C)).
 Spray rinse in deionized water for 2 minutes (Water temperature=95° F. (35° C.)).

(c) Prep Panel
 MACuPrep™ Etch G-4 solution at 100° F. (37.8° C.).
 Dip panel in solution with active agitation for 1 minute.

(d) Water Spray Rinse
 Dip rinse with agitation in deionized water for 2 minutes water temperature=95° F. (35° C.)).
 Spray rinse in deionized water for 2 minutes (water temperature=95° F. (35° C.)).

(e) Acid Treat Panel
 Solution of 10% $H_2SO_4$ at 100° F. (37.8° C.).
 Dip panel in solution with active agitation for 1 minute.

(f) Electroplate Cooper
 MACu SPEC™ 9241 acid copper solution at 90° F. (32.2° C.).
 Dip panel in electroplating solution with active agitation and plating for 36 minutes.

(g) Water Spray Rinse
 Dip rinse with agitation in deionized water for 2 minutes (water temperature=95° F. (35° C.)).
 Spray rinse in deionized water for 2 minutes (water temperature=95° F. (35° C.)).

(h) Clean Copper
 Fluroboric acid at 100° F. (37.8° C.).
 Dip panel in solution with active agitation for 1 minute.

(i) Electroplate Tin/Lead
 TARTAN™ Sn-Pb Plating solution at 90° F. (32.2° C.).
 Dip panel in electroplating solution with active agitation and plating for 36 minutes.

(j) Water Spray Rinse
 Dip rinse with agitation in deionized water for 2 minutes (water temperature=95° F. (35° C.)).
 Spray rinse in deionized water for 2 minutes (water temperature=95° F. (35° C.)).

(k) Dry Panel
 Dry panel with warm air dryer.

(10) Strip and etch any conductive copper paths which must be removed from the top of the laminated three-layer board 124. In order to perform the strip and etch step, perform the following process steps:

(a) Strip Resist Pattern
 Use DFS-12G resist stripper solution at 95° F. (35° C.).
 Dip process panel in tank with agitation for 6 minutes. After processing ensure that all traces of photoresist are gone before proceeding to the next step.

(b) Water Spray Rinse
 Dip rinse with agitation in deionized water for 2 minutes (water temperature=95° F. (35° C.)).
 Spray rinse in deionized water for 2 minutes (water temperature=95° F. (35° C.)).

(c) Etch Panel
 SP-20 Etching solution at 95° F. (35° C.).
 Dip panel in solution with active agitation for 1 minute.

(d) Water Spray Rinse
 Dip rinse with agitation in deionized water for 2 minutes (water temperature=95° F. (35° C.)).
 Spray rinse in deionized water for 2 minutes (water temperature=95° F. (35° C.)).

(e) Dry Panel
 Dry panel with warm air dryer.

(11) Note: the laminated three-layer stacks 124 can be individual laminated to other laminated three-layer stacks 124 in any combination of order, then milled and drilled as necessary in order to meet the customer circuit path requirements. However, each laminated three-layer stack 124 must first be evaluated.

INNER LAYER PRODUCT EVALUATION STEP 24: Perform the following steps to ensure that the correction factors are still current, and that all process steps are within tolerance:

Three dimensional X-ray Test of three-layer board 124: To ensure that current correction factors are still valid.

Electrical test: To ensure that the board 124 has come through all processing steps correctly.

LAMINATION OF BOARD STEP 26: The lamination of the board is performed using the correction factors which have been computed for the particular batch of material being used, and the order in which the inner layers are stacked.

Figure 9:
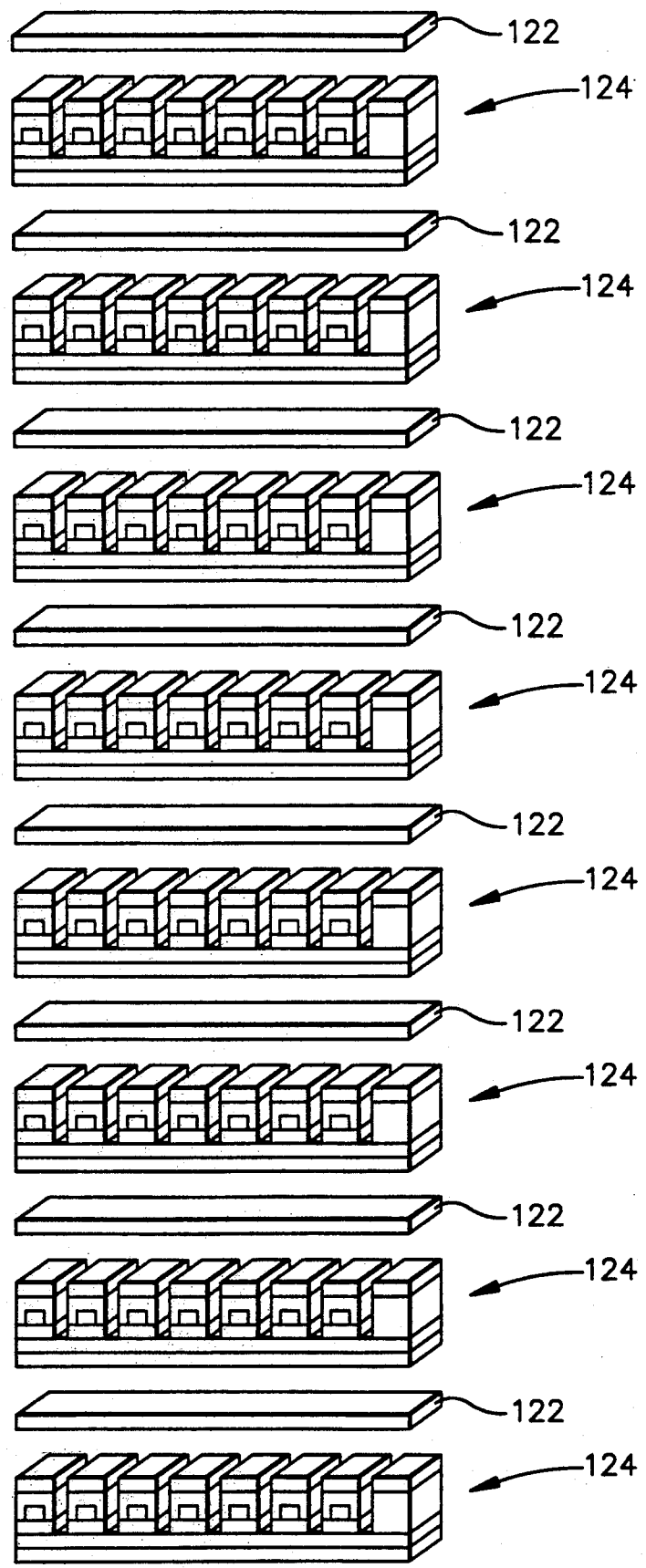
FIG. 9 is an exploded isometric view of a stack-up of eight laminated three-layer printed circuit boards which have been manufactured in accordance with the method of the present invention, including a top layer of pre-preg material which is to cover the top of the final laminated printed circuit board.
Figure 10:
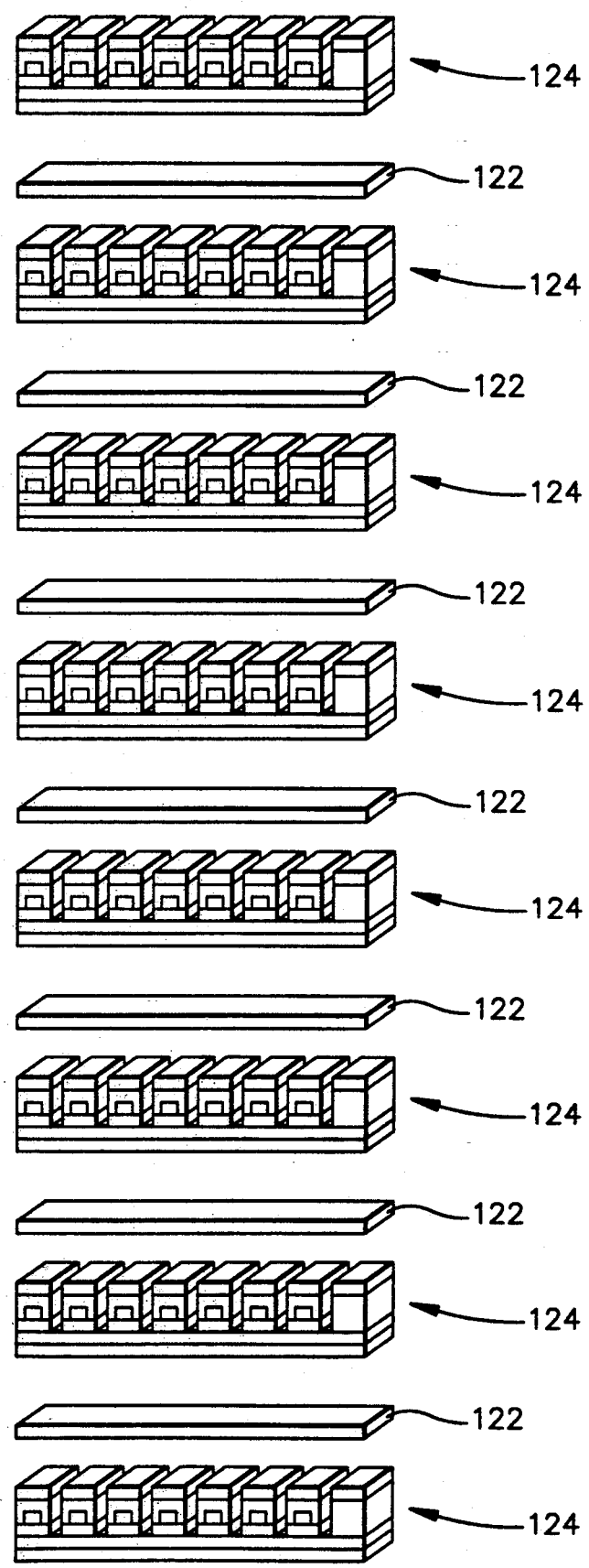
FIG. 10 is an exploded isometric view of a stack-up of eight laminated three-layer printed circuit boards which have been manufactured in accordance with the method of the present invention, wherein a top layer of pre-preg material is not included so that the top of the final laminated printed circuit board product can be etched a final time.

(1) The laminated three-layer printed circuit boards 124 are now combined in individual steps, or all at once, as per customer requirements. The laminated three-layer boards 124 are stacked up with layers of pre-preg material 122 between each laminated three-layer board 124 (see FIGS. 9 and 10).

(2) The very top layer of pre-preg material 122 is optional. It is used (FIG. 9) if it is desirable to completely protect the top conductive copper layer 102 of the top laminated three-layer board 124. It is not used (FIG. 10) if it is desirable to etch some of the top conductive copper layer 102 of the top laminated three-layer board 124.

(3) The physical process for laminating multi-layer printed circuit boards is known in the prior art. In the preferred embodiment, a standard laminating press is used to both apply heat and pressure to the multi-layer stack-up of the printed circuit boards.

(4) The stack-up of printed circuit boards is placed into the lamination press, which is then heated up from 70° F. to 360° F. (21.1° to 182.2° C.) at the rate of 9–12° F. (5–6.7° C.) per minute.

(5) The cure process requires the stack-up of printed circuit boards to remain in the lamination press for 90 minutes at 360° F. (182.2° C.).

(6) Once the cure has been completed, the press is cooled down to 70° F. (21.1° C.) at a rate of 9–12° F. (5–6.7° C.) per minute.

(7) In steps (4), (5), and (6), it is very important to control the pressure of the laminating press as follows: as the oven is heated from 70–200° F. (21.1–93.3° C.) the pressure must be maintained at 50 psi. Once the temperature reaches 250° F. (121.1° C.), the pressure must be raised to 300 psi through the heat build-up to 360° F. (182.2° C.) and continuing for the entire cure cycle at 360° F. (182.2° C.). The 300 psi pressure is maintained during the cool-down until the temperature goes below 200° F. (93.3° C.). At that point, the pressure is lowered to 50 psi until the temperature is back down to 70° F. (21.1° C.).

PROCESSING OF OUTER LAYERS STEP 28.

The steps involved in the process are:
(1) Material Drilling.
(2) Deposition of Conductive Copper.
(3) Mask Plating Pattern.
(4) Pattern Plating.
(5) Strip and Etch.

Material Drilling and Milling. The laminated material is drilled according to desired hole pattern requested by the customer. The laminated material is also milled and drilled, both in the vertical and horizontal axes, in order to create the necessary slots and holes to allow conductive paths to reach from the inner layers to the outer surface of the laminated board.

Deposition of Conductive Copper: The purpose of this procedure is to plate the interior walls of the holes with copper to allow signals to travel from the copper on the top to the copper on the bottom, and to inner layers. This step is known in the art.

(1) Chemically Condition Holes
A liquid alkaline cleaner is used to remove light oils, fingerprints, and contaminants from the surface of copper clad printed circuit board laminates. Such a cleaner also conditions the hole wall for better activation, and helps to assure a more reliable electroless copper deposit. The preferred hole conditioner is available under the trade name MACuDizer TM 6183, manufactured by MacDermid, Inc.

MACuDizer TM 6183 Hole Conditioner Solution at 120° F. (48.9° C.).
Dip panel in solution with active agitation for 5 minutes.

(2) Water Rinse
Dip rinse with agitation in deionized water for 2 minutes (water temperature=140° F. (60° C.)).
Spay rinse in deionized water for 2 minutes (water temperature=120° F. (48.9° C.))

(3) Chemically Clean Holes
To chemically clean the holes, alkaline permanganate is used to remove drill debris and increase hole wall topography by selective oxidation of the resin. In this way, the chemically cleaning of the holes promotes good electroless copper coverage and adhesion. The preferred hole cleaner is an etch back solution known under the trade name MACuDizer TM 9206, manufactured by MacDermid, Inc.

MACuDizer TM 9206 Etchback Solution at 160° F. (71.1° C.).
Dip panel in solution with active agitation for 7 minutes.

(4) Water Rinse
Dip rinse with agitation in deionized water for 2 minutes (water temperature=140° F. (60° C.)).
Spray rinse in deionized water for 2 minutes (water temperature 120° F. (48.9° C.).)

(5) Neutralize
At this point, a solution is used to neutralize the permanganate and manganese dioxide residues. The solution provides a clean hole wall prior to the electroless copper deposition. The preferred neutralizer used is available under the trade name MACuDizer TM 9279, manufactured by MacDermid, Inc.

MACuDizer TM 9279 Neutralizer solution at 110° F. (43.3° C.).
Dip panel in solution with active agitation for 7 minutes.

(6) Water Rinse
Dip rinse with agitation in deionized water for 2 minutes (water temperature=100° F. (37.8° C.).)
Spray rinse in deionized water for 2 minutes (water temperature=100° F. (37.8° C.).)

(7) Glass Etchback
At this point, a glass etch solution is used which can either frost glass fiber tips, or at higher concentrations, completely remove glass fibers. The preferred glass etch solution used is available under the trade name MACuDizer TM 9278, manufactured by MacDermid, Inc.

MACuDizer TM 9278 Glass Etch solution at 100° F. (37.8° C.).
Dip panel in solution with active agitation for 4 minutes.

(8) Water Rinse
Dip rinse with agitation in deionized water for 2 minutes (water temperature=100° F. (37.8° C.).)
Spray rinse in deionized water for 2 minutes (water temperature=100° F. (37.8° C.).)

(9) Acid Prep
Solution of 10% $H_2SO_4$ at 100° F. (37.8° C.).
Dip panel in solution with active agitation for 2 minutes.

(10) Water Rinse
Dip rinse with agitation in deionized water for 2 minutes (water temperature=100° F. (37.8° C.).)
Spray rinse in deionized water for 2 minutes (water temperature=105° F. (40.5° C.)).

(11) Prime
A primer solution is now used which is a mild alkaline chelated conditioner system. This can be used with in-line permanganate, chromic acid, or sulfuric acid, desmear/etchback pretreatment. The preferred primer solution is available under the tradename MACuDizer ™ 92, manufactured by MacDermid, Inc.

MACuDizer ™ 92 Primer solution at 110° F. (43.3° C.).

Dip panel in solution with active agitation for 7 minutes.

(12) Water Rinse

Dip rinse with agitation in deionized water for 2 minutes (water temperature=105° F. (40.5° C.)).

Spray rinse in deionized water for 2 minutes (water temperature=100° F. (37.8° C.).)

MACuPrep ™ Etch G-4 solution at 100° F. (37.8° C.).

Dip panel in solution with active agitation for 1 minute.

(13) Water Rinse

Dip rinse with agitation in deionized water for 2 minutes (water temperature=100° F. (37.8° C.).)

Spray rinse in deionized water for 2 minutes (water temperature=100° F. (37.8° C.).)

(14) Acid Clear

Solution of 10% $H_2SO_4$ at 100° F. (37.8° C.).

Dip panel in solution with active agitation for 2 minutes.

(15) Water Rinse

Dip rinse with agitation in deionized water for 2 minutes (water temperature=90° F. (32.2° C.).)

Spray rinse in deionized water for 2 minutes (water temperature 80° F. (26.7° C.)).

(16) Predip

A predip bath is used prior to a prep activator process. This bath maintains the chemical balance of the activator and eliminates the use of hydrochloric acid. It also prepares surfaces for uniform absorption of the activator. The preferred predip bath is available under the trade name MACuPrep ™ 93, manufactured by MacDermid, Inc.

MACuPrep ™ 93 Predip solution at 70° F. (21.1° C.).

Dip panel in solution with active agitation for 30 seconds.

(17) Activator

MACuPrep ™ 93 Predip solution at 70° F. (21.1° C.).

Dip panel in solution with active agitation for 45 seconds.

(18) Water Rinse

Dip rinse with agitation in deionized water for 2 minutes (water temperature=70° F. (21.1° C.).)

Spray rinse in deionized water for 2 minutes (water temperature=80° F. (26.7° C.)).

(19) Accelerator

An alkaline process is now used which optimizes catalytic activity on glass and other dielectric materials. This process also provides for void-free electroless copper deposition. The process will not attack the oxide on copper innerlayers. The preferred accelerator solution is available under the trade name MACuPrep ™ 97, which is manufactured by MacDermid, Inc.

MACuPrep ™ 97 Accelerator solution at 90° F. (32.2° C.).

Dip panel in solution with active agitation for 2 minutes.

(20) Water Rinse

Dip rinse with agitation in deionized water for 2 minutes (water temperature=95 degree F. (35° C.)).

Spray rinse in deionized water for 2 minutes (water temperature=95° F. (35° C.)).

(21) Electroless Copper

An electroless copper solution is used which provides a bright pink copper deposit in excess of 100 micro inches in thirty (30) minutes at elevated temperatures. The preferred electroless copper solution is available under the trade name MACuDep ™ 850, which is manufactured by MacDermid, Inc.

Use MACuDep ™ 850 solution at 95° F. (35° C.).

Dip panel in solution with active agitation for 25 minutes.

(22) Water Rinse

Dip rinse with agitation in deionized water for 2 minutes (water temperature=95° F. (35° C.)).

Spray rinse in deionized water for 2 minutes (water temperature=95° F. (35° C.)).

(23) Anti-Tarnish

A liquid is now used to provide temporary protection from tarnish for copper. A liquid which is used after metal treatment and deposition operations to provide temporary tarnish protection for copper is used in the preferred. The preferred embodiment anti-tarnish solution is available under the trade name Metex ™ M-667, and is manufactured by MacDermid, Inc.

Metex ™ M-667 Anti-tarnish solution at 90° F. (32.2° C.).

Dip panel in solution with active agitation for 30 seconds.

(24) Water Rinse

Dip rinse with agitation in deionized water for 2 minutes (water temperature=95° F. (35° C.)).

Spray rinse in deionized water for 2 minutes (water temperature=95° F. (35° C.)).

(25) Dry

Dry panel with warm air dryer.

Back-fill vertical holes and slots: The purpose of this step is to fill in any open holes or slots with electrically insulative material.

(1) Fill Holes With Insulation:
Use either pre-preg or raw resin powder. If the holes or slots are too small for the use of pre-preg, then raw resin must be used.

(2) Remove Excess Insulation:
Use a squeegee to remove any excess pre-preg material or raw resin powder from the top surface of the laminated printed circuit board.

(3) Cure the pre-preg or raw resin in the lamination press utilizing a further lamination process of the multi-layer board.

Mask Plating Pattern: The purpose of this series of steps is to mask the areas of the board which will NOT have copper traces to prevent copper and tin/lead plating in areas which will occur in later steps. This step is known in the art.

(1) Laminate Resist
Laminate photoresist using hot roll laminator at 230–250° F. (110–121.1° C.).

(2) Cure Resist
Let sit at room temperature for 15 minutes.

(3) Expose Photo Resist
Expose for 3.5 minutes using the BTX-200 ultraviolet exposure unit.

(4) Post Cure Resist

Let sit at room temperature 15 minutes.
(5) Develop Exposed Pattern
Use DFD-12G developing solution.
Spray develop for 1.5 minutes.
(6) Water Spray Rinse
Dip rinse with agitation in deionized water for 2 minutes (water temperature=95° F. (35° C.)).
Spray rinse in deionized water for 2 minutes (water temperature=95° F. (35° C.)).

Pattern Plating: The purpose of this series of steps is to build up the copper thickness in the following areas:
Hole Walls
Copper Traces
After the copper has been built up, Tin/Lead is plated on top of the copper. This step is known in the art.

Process Steps (1) Chemically Clean Copper
Metex ™ 9268 cleaner solution at 90° F. (32.2° C.).
Dip panel in solution with active agitation for 30 seconds.
(2) Water Spray Rinse
Dip rinse with agitation in deionized water for 2 minutes (water temperature=95° F. (35° C.)).
Spray rinse in deionized water for 2 minutes (water temperature=95° F. (35° C.)).
(3) Prep Panel
MACuPrep ™ Etch G-4 solution at 100° F. (37.8° C.).
Dip panel in solution with active agitation for 1 minute.
(4) Water Spray Rinse
Dip rinse with agitation in deionized water for 2 minutes (water temperature=95° F. (35° C.)).
Spray rinse in deionized water for 2 minutes (water temperature=95° F. (35° C.)).
(5) Acid Treat Panel
Solution of 10% $H_2SO_4$ at 100° F. (37.8° C.).
Dip panel in solution with active agitation for 1 minute.
(6) Electroplate Copper
MACu SPEC ™ 9241 acid copper solution at 90° F. (32.2° C.).
Dip panel in electroplating solution with active agitation and plating for 36 minutes.
(7) Water Spray Rinse
Dip rinse with agitation in deionized water for 2 minutes (water temperature=95° F. (35° C.)).
Spray rinse in deionized water for 2 minutes (water temperature=95° F. (35° C.)).
(8) Clean Copper
Fluroboric acid at 100° F. (37.8° C.).
Dip panel in solution with active agitation for 1 minute.
(9) Electroplate Tin/Lead
TARTAN ™ Sn-Pb Plating solution at 90° F. (32.2° C.).
Dip panel in electroplating solution with active agitation and plating for 36 minutes.
(10) Water Spray Rinse
Dip rinse with agitation in deionized water for 2 minutes (water temperature=95° F. (35° C.)).
Spray rinse in deionized water for 2 minutes (water temperature=95° F. (35° C.)).
(11) Dry Panel
Dry panel with warm air dryer.

Strip and Etch: The purpose of this series of steps is to remove any unwanted copper from the top and bottom layers of the board. This step is known in the art.
(1) Strip Resist Pattern
Use DFS-12G resist stripper solution at 95° F. (35° C.).
Dip process panel in tank with agitation for 6 minutes After processing ensure that all traces of photoresist are gone before proceeding to the next step.
(2) Water Spray Rinse
Dip rinse with agitation in deionized water for 2 minutes (water temperature=95° F. (35° C.)).
Spray rinse in deionized water for 2 minutes (water temperature=95° F. (35° C.)).
(3) Etch Panel
SP-20 Etching solution at 95° F. (35° C.).
Dip panel in solution with active agitation for 1 minute.
(4) Water Spray Rinse
Dip rinse with agitation in deionized water for 2 minutes (water temperature=95° F. (35° C.)).
Spray rinse in deionized water for 2 minutes (water temperature=95° F. (35° C.)).
(5) Dry Panel
Dry panel with warm air dryer.

OUTER LAYER PRODUCT EVALUATION STEP 30: Perform the following steps to ensure that the correction factors are still current, and that all process steps are within tolerance:
Three dimensional X-ray Test: To ensure that current correction factors are still valid.
Electrical Test: To ensure that the board has come through all processing steps correctly.
FINAL QUALITY CONTROL STEP 32: Perform electrical and visual test to ensure that the board has come through all processing steps correctly.

Figure 11:
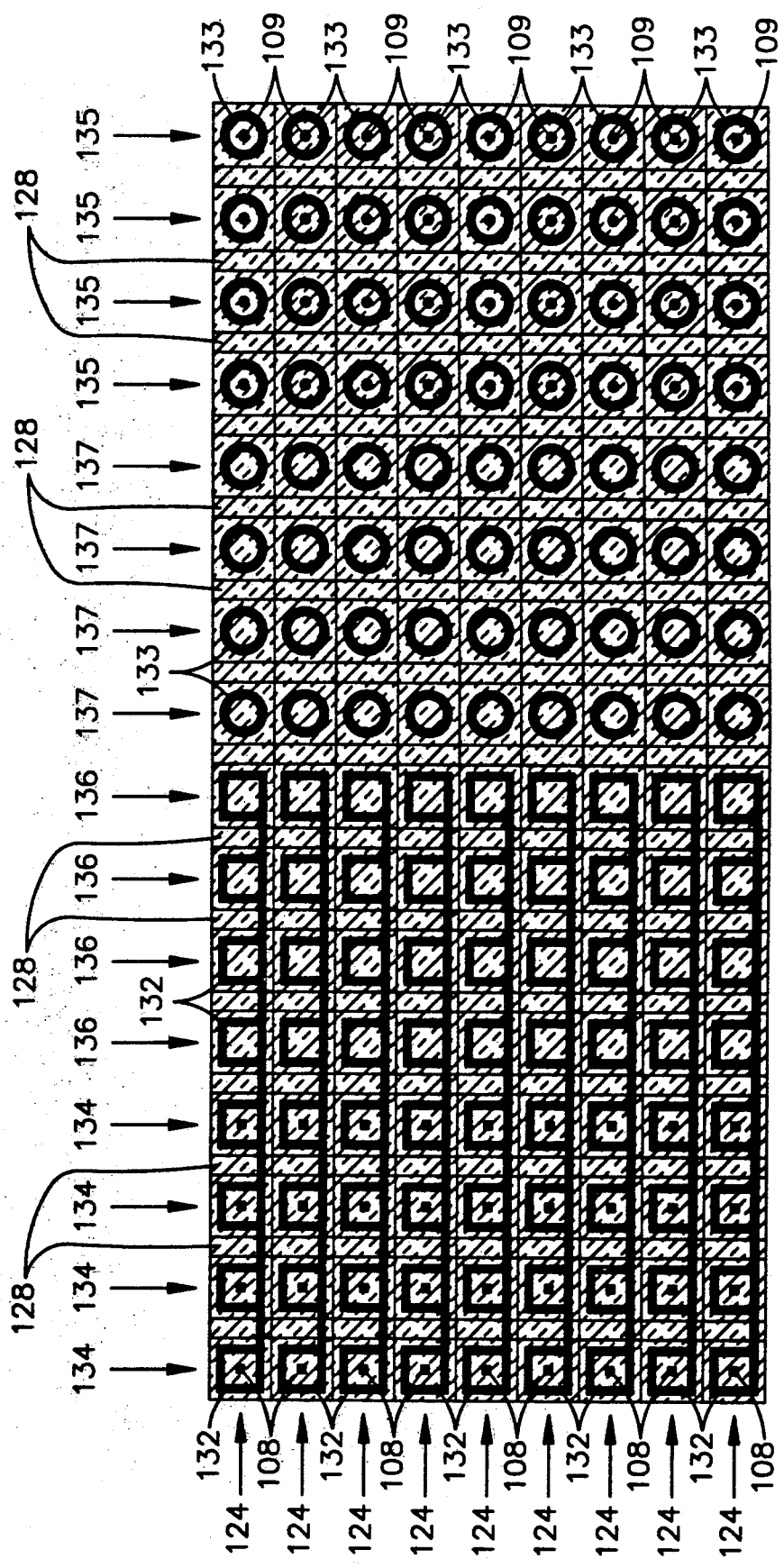
FIG. 11 is a cross-section elevational view of a 27-layer laminated printed circuit board manufactured in accordance with the method of the present invention, wherein each vertical run of conductive copper includes nine sets of either coaxial cable equivalents or tuned wave guide equivalents.

An end section view of a 27-layer printed circuit board 130 built according to the illustrated embodiment is depicted in FIG. 11. In FIG. 11, there are nine stacks of three-layer laminated printed circuit boards 124 which were made in the intermediate inner-layer steps. Located along the left-hand column are nine square coaxial cable equivalents 134. In each square coaxial cable equivalent 134 there is an inner-conductor 108, and an outer-conductor 132. Located in each left-hand inner column is nine square wave guide equivalents 136. The square wave guide equivalents 136 consist of only an outer conductor 136. The square wave guide equivalent 136 has no inner-conductor, but instead, is completely filled with insulative material. FIG. 11 does not depict any vertical conductive runs which reach the inner-conductors 108 of any of the square coaxial cable equivalents 134. The spaces between each set of vertical coaxial cable equivalents or wave guide equivalents is filled with insulative material 128. Located along the right-hand column are nine round coaxial cable equivalents 135. In each round coaxial cable equivalent 135 there is a round inner-conductor 109, and a round outer-conductor 133. Located in each right-hand inner column is nine round wave guide equivalents 137. The round wave guide equivalents 137 consist of only an outer conductor 137. The round wave guide equivalent 137 has no inner-conductor, but instead, is completely filled with insulative material.

Figure 12:
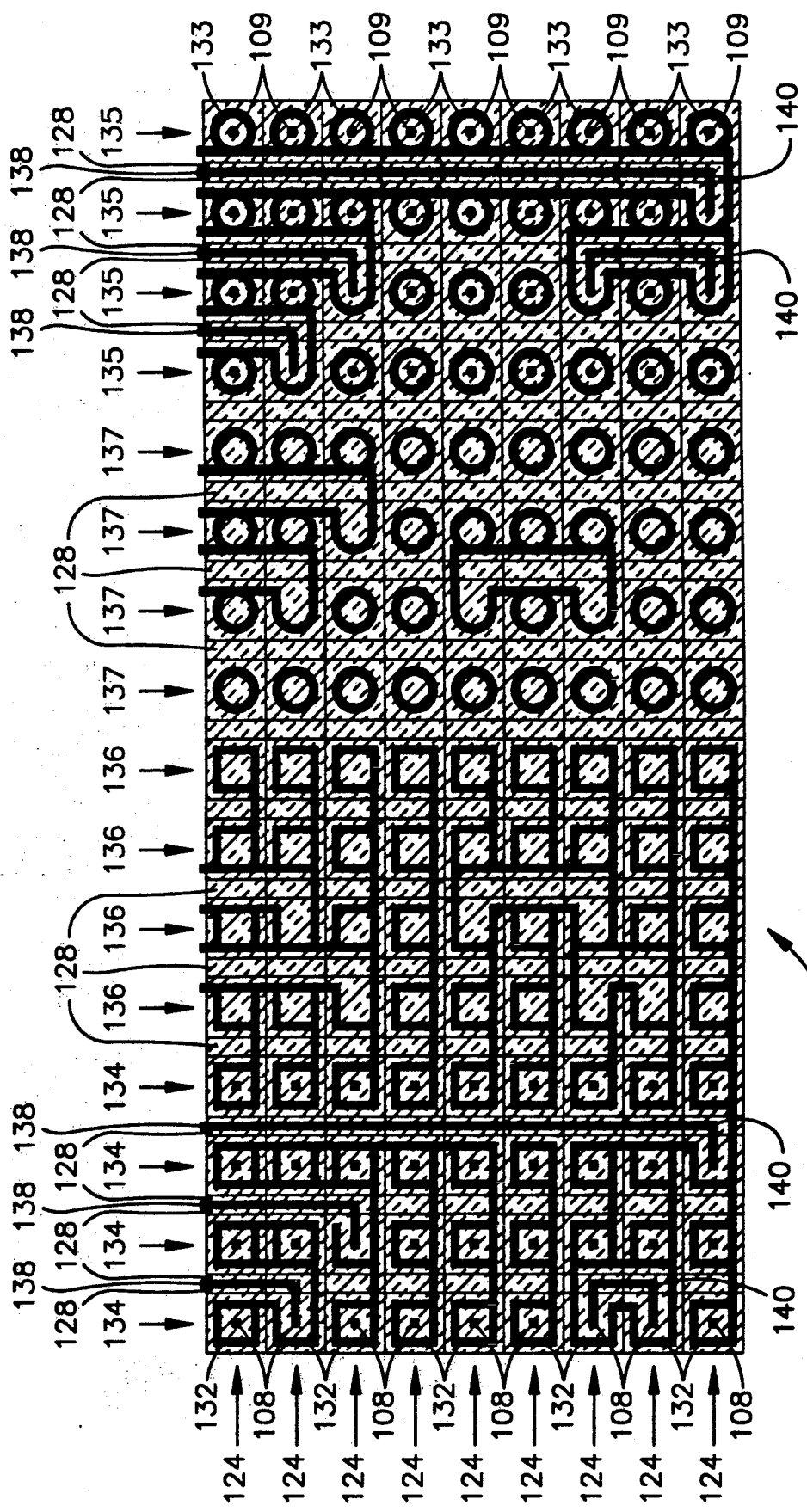
FIG. 12 is a cross-section elevational view of a 27-layer laminated printed circuit board manufactured in accordance with the method of the present invention, similar to that of FIG. 11, illustrating a number of vertical conductive runs which connect some of the inner layers to one another, and which connect some of the inner layers to the top layer for the purpose of connecting inner signals to the outside world.

Another end section view of a 27-layer printed circuit board is depicted in FIG. 12. FIG. 12 depicts a different slice out of a multi-layer printed circuit board, inasmuch as it shows vertical conductive runs 138. The vertical conductive connecting runs 138 are used for connecting circuits from lower layers to circuits in upper layers, or all the way to the top layer. These vertical conductive connecting runs 138 are built as per customer requirements. The vertical conductive connecting runs 138 are formed within the vertical insulative material 128. In this way, the square coaxial cable equivalents 134 and the square wave guide equivalents 136 are electrically insulated from the vertical conductive connecting runs 138.

Figure 13:
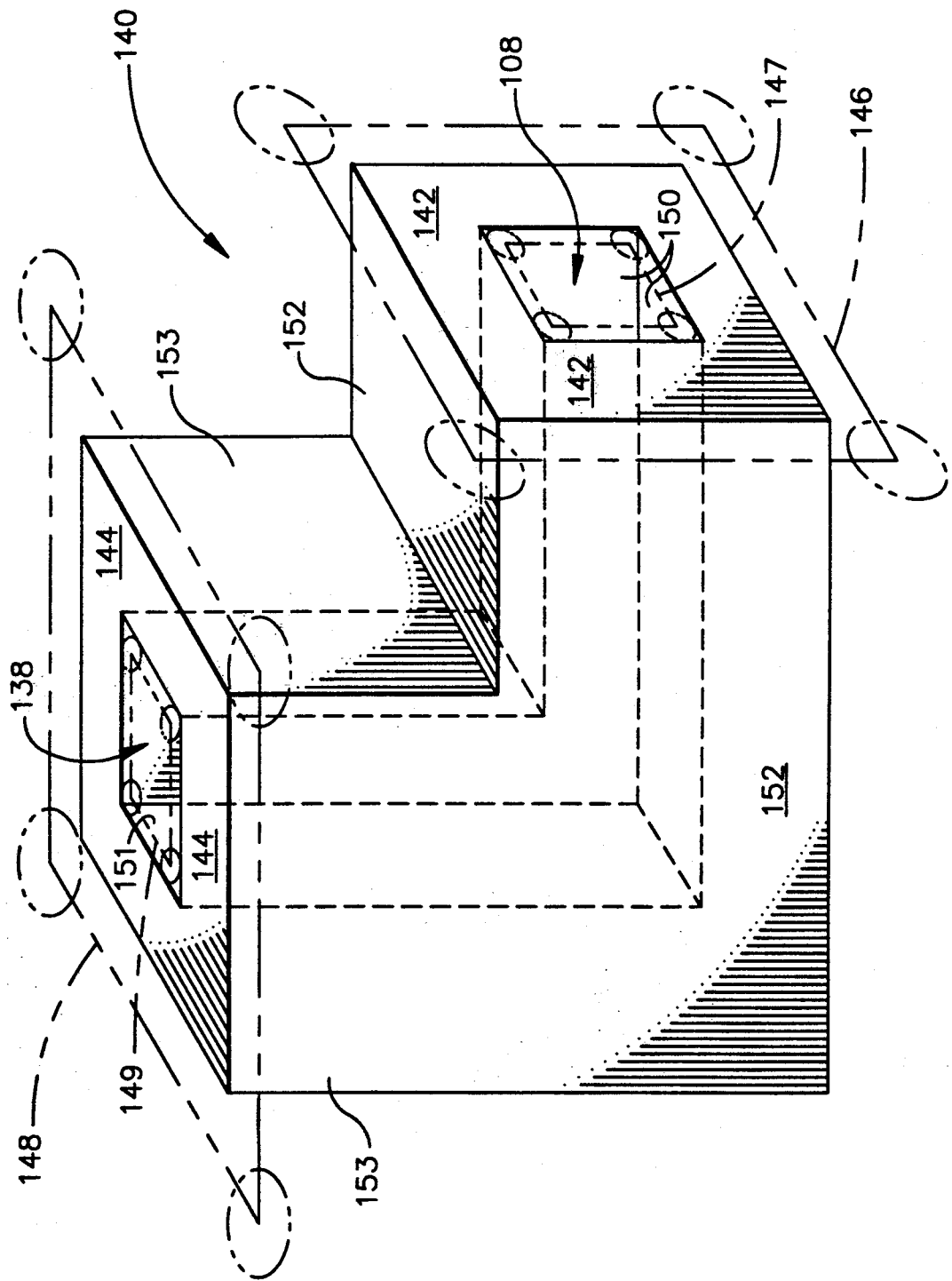
FIG. 13 is an isometric view of a right-angle coaxial cable equivalent connection, wherein a horizontal square coaxial cable equivalent is electrically connected to a similar vertical square coaxial cable equivalent.

Included in the method for building multi-layer printed circuit boards according to the present invention is the process for making electrical connections between vertical conductive circuits and horizontal conductive circuits. The details of such a connection are given in FIG. 13. FIG. 13 depicts an inner conductor, forming a right-angle connection, and surrounded by insulative material, which, in turn, is surrounded by another outer layer of conductive material, forming a second right-angle connection. In this way, coaxial cable equivalents are produced having a right-angle connection 140.

To create the vertical portion of the right-angle connection, a milling tool is run along the outer surface of the vertical insulative material 144. The vertical milling tool path is designated by the numeral 148. The vertical milling tool path 149 is followed to create an inner milled slot which will become an inner layer of conductive copper 151. Similar milling tool paths are used to create the horizontal portion of the right-angle conductive connection 140. The horizontal milling tool path 146 is used to properly shape the outer surface of the horizontal insulative material 142. The inner-horizontal milling tool path 147 is used to create a slot which will become the inner layer horizontal conductive copper path 150.

After all of the above milling tool steps have taken place, then the insulative material is plated with conductive copper. Both inner layer and outer layer paths are formed as follows: an inner layer horizontal conductive copper path is depicted at 150, an inner layer vertical conductive copper path is depicted at 151; an outer layer horizontal conductive copper path is depicted at 152, and an outer layer vertical conductive copper path is depicted at 153. As can be seen, the above method creates a pair of square coaxial equivalent circuits which are connected at a right-angle, as shown in FIG. 13.

Figure 14B:
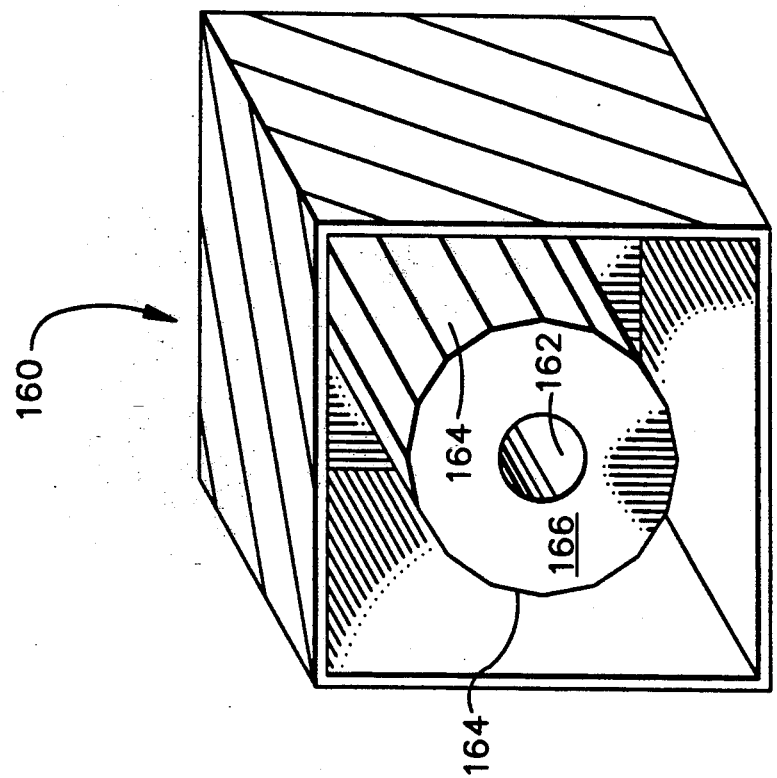
Figure 14A:
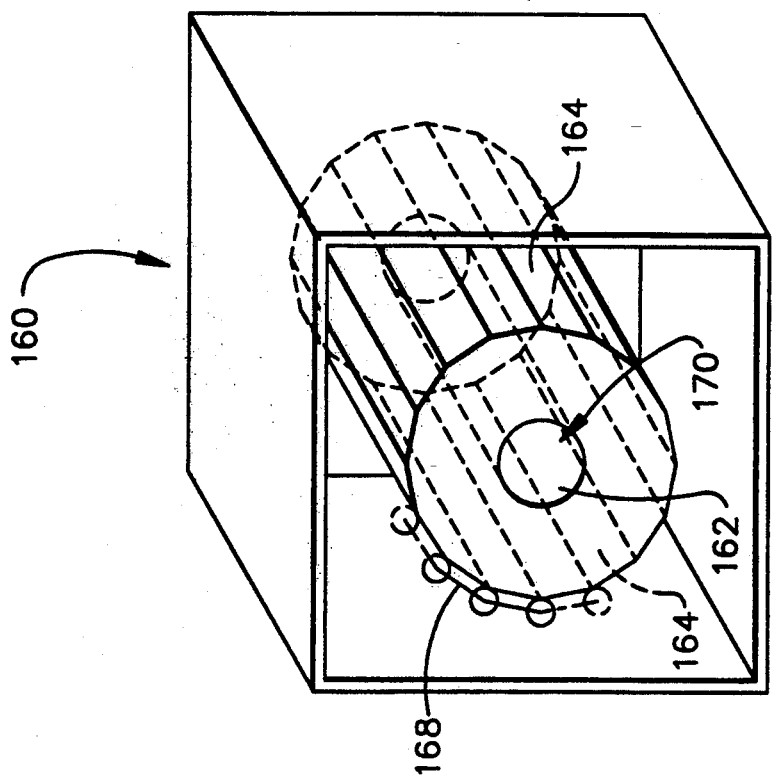

If the type of signal being transmitted through the multi-layer printed circuit board will not work well with square coaxial cable equivalents or square wave guide equivalents, then circular-shaped such circuit equivalents can be made. FIGS. 14a and 14b show such round circuit equivalents. In these figures, a horizontal round coaxial cable equivalent is depicted, however, it is obvious that a round wave guide equivalent could also be formed. It is also obvious that both type of equivalents could also be formed in the vertical direction.

In order to form a round coaxial cable equivalent 160, the insulative material 166 must be milled and drilled into the proper shape. The round coaxial cable equivalent milling tool path is depicted by the numeral 168. If a perfectly accurate milling machine tool is available then milling path 168 can be defined as a round circle. It is more realistic, however, to define such a circle as a series of small line segments. If the number of such small line segments is great enough, then the line segments will approximate a circle. After the milling step of milling path 168 has occurred, then a small drilling tool is used to create a hole at 170. Once both the milling and drilling steps are completed, then the insulative material 166 is plated with conductive copper material. After this plating step has occurred, there will exist an outer round conductor 164, and an inner round conductor 162. Of course, there will also be conductive copper plated over the outer most edge of the insulative material 166, and this must be etched away in order to have the inner and outer conductors electrically isolated from one another.

Figure 3:
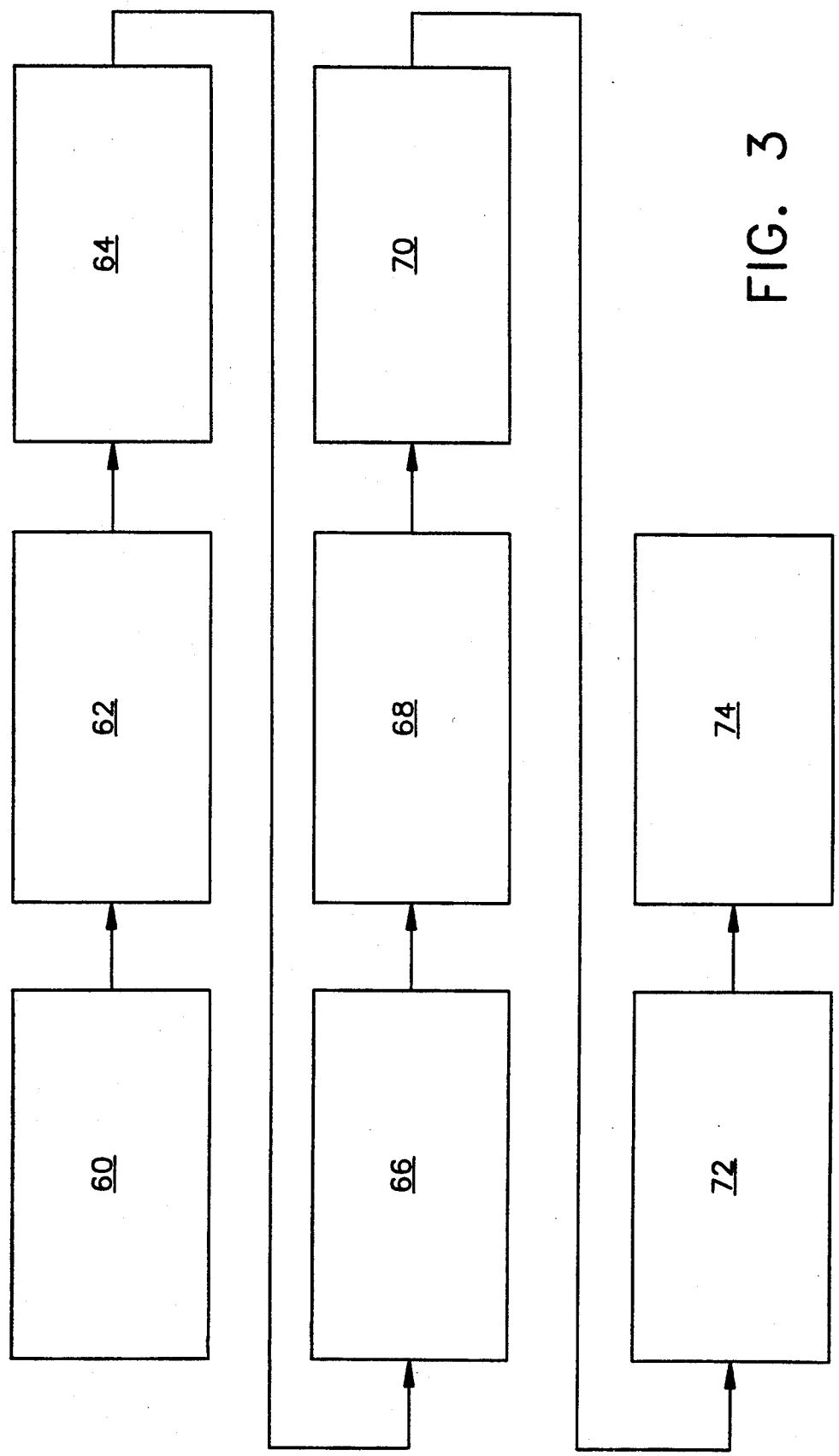
FIG. 3 is a block diagram illustrating in flow chart form the method for making a high precision double-sided printed circuit board in accordance with the present invention.
Figure 4:
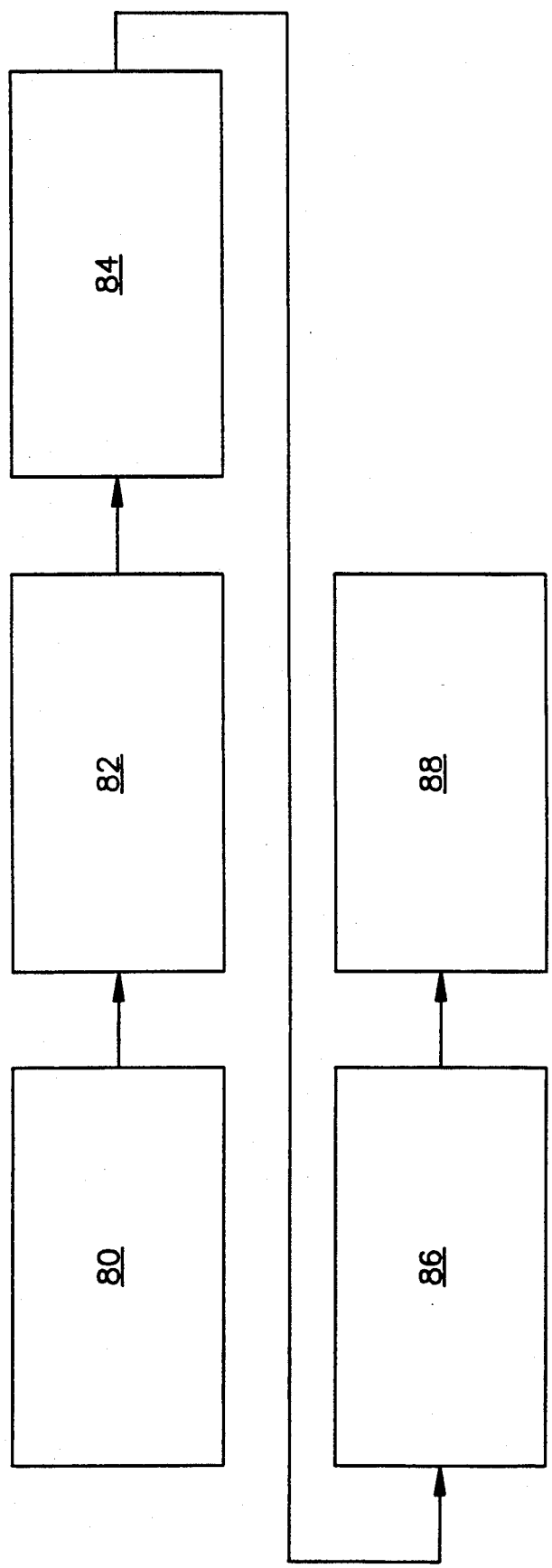
FIG. 4 is a block diagram illustrating a conventional method for making a double-sided printed circuit board known in the prior art.

Many of the above method steps which are used for making multi-layer printed circuit boards can also be used to make double-sided printed circuit boards. FIG. 3 shows a block diagram of the method for making high precision double-sided printed circuit boards. FIG. 3 depicts eight process steps, which are as follows:
 (1) Material Ordering and Receiving
 (2) Material Short-term storage
 (3) Material Grading
 (4) Material Long-Term Storage
 (5) Material Selection
 (6) Artwork Computations and Adjustments
 (7) Processing of Double-Sided Board
 (8) Product Evaluation and Final Quality Control MATERIAL ORDERING AND RECEIVING STEP 60: The raw materials are ordered according to the basic customer needs and current inventory stocking needs. Particular attention is paid to what batch and/or lot numbers the raw materials belongs to. When the materials are received, they are grouped according to their specific batch and/or lot numbers.

MATERIAL SHORT-TERM STORAGE STEP 62: The incoming material is received into a standard holding area for at least 48 hours to allow the material to come to the current storage temperature and humidity conditions.

MATERIAL GRADING STEP 64: Correct material selection and grading is paramount to the correct functioning of all further high precision printed circuit board processing steps. One of the KEY high precision printed circuit board processing steps is the addition of the precision raw material grading process. For each lot of incoming material, the manufacturer's resin batch number and manufacturing lot numbers must be recorded.

The material grading process involves the following steps:
 (1) Create three double-sided boards using material FROM the SAME resin BATCH NUMBER and the SAME manufacturing LOT NUMBER. These boards shall use the standard image stepped across each layer. The standard image is defined in FIG. 5. All processing of these boards shall be according to the manufacturer established guidelines for the particular material. Other sections of this document give detailed examples for particular materials.
 (2) Create three dimensional X-ray images of the three double sided boards. The three dimensional images of the boards are made using an industrial version of the CAT scanner. The resolution of the scanner employed is 0.000001" (0.0000254 mm). The information gathered will be used to compute the following information:
 X and Y axis Drift.
 Z axis Drift, also referred to as Z axis "shift".

X, Y and Z axis Drift, also referred to as X, Y, and Z axis "quiver".

(3) The information gathered from the above two steps is used to compute any basic correction factors for the imaging and etching systems prior to creating the precision test boards. The primary information revealed in this step is what basic set of correction factors should be applied to the artwork to account for imaging and etching system variations.

(4) Compute the correction factors which should be applied to the printed circuit artwork to account for the variations encountered in the test pieces. The corrections which could be applied to any given artwork are:
   (a) Line Width, to control the line impedance based on the final thickness and actual measured dielectric constants for a given batch of raw materials.
   (b) Line Width variations along the path to account for traceable variations in the etching system.
   (c) Line Width variations along the path to account for traceable variations in the lamination process.
   (d) Stretching or shrinking the artwork to account for major X or Y axis shifting of the substrate during the lamination portion of the process.
   (e) Altering the drilling machine instructions to suit the final actual pattern to be drilled.

After the initial artwork correction factors have been computed, the material is then able to be put into the production inventory.

MATERIAL LONG-TERM STORAGE STEP 66: The pre-graded material is stored under constant temperature and humidity conditions to ensure that the material remains stable for as long as possible. If material is retained in storage longer than the standards acceptable to each material type, then the grading process must be repeated to ensure that the correction factors agree with current state of the raw material.

MATERIAL SELECTION STEP 68. In high precision printed circuit board double-sided printed circuit production material is selected based on the following characteristics:
   Material Type
   Material Thickness
   Copper Thickness
   Material Grading Data; The material grading factors which must be matched for a processing run are:
      (a) X and Y axis Drift.
      (b) Z axis Drift (shift).
      (c) X, Y and Z axis Drift.(quiver)

ARTWORK COMPUTATION AND ADJUSTMENTS STEP 70: In this series of steps, the Material grading factors are used to make changes in the customer standard artwork data to provide the required correction factors which this batch of material and processing equipment will need for the finished product to be reflection of the original customer artwork data.

PROCESSING OF DOUBLE-SIDED BOARD STEP 72. The steps involved in the process are:
   (1) Material Drilling.
   (2) Deposition of Conductive Copper.
   (3) Mask Plating Pattern.
   (4) Pattern Plating.
   (5) Strip and Etch.

Material Drilling: The selected material is drilled according to desired hole pattern requested by the customer, with the addition of tooling and registration holes which fall outside the customer defined working area. The tooling and registration holes are used for process handling and artwork registration during the processing of the material.

Deposition of Conductive Copper: The purpose of this procedure is to plate the interior walls of the holes with copper to allow signals to travel from the copper on the top to the copper on the bottom. This step is known in the art.
   (1) Chemically Condition Holes
      MACuDizer TM 6183 Hole Conditioner Solution at 160° F. (71.1° C.).
      Dip panel in solution with active agitation for 5 minutes.
   (2) Water Rinse
      Dip rinse with agitation in deionized water for 2 minutes (water temperature=140° F. (60° C.)).
      Spay rinse in deionized water for 2 minutes (water temperature=120° F. (48.9° C.))
   (3) Neutralize
      MACuDizer TM 9279 Neutralizer solution at 110° F. (43.3° C.).
      Dip panel in solution with active agitation for 7 minutes.
   (4) Water Rinse
      Dip rinse with agitation in deionized water for 2 minutes (water temperature=100° F. (37 8° C.).)
      Spray rinse in deionized water for 2 minutes (water temperature 100° F. (37.8° C.).)
   (5) Glass Etchback
      MACuDizer TM 9278 Glass Etch solution at 100° F. (37.8° C.).
      Dip panel in solution with active agitation for 4 minutes.
   (6) Water Rinse
      Dip rinse with agitation in deionized water for 2 minutes (water temperature=100° F. (37.8° C.).)
      Spray rinse in deionized water for 2 minutes (water temperature=100° F. (37.8° C.).)
   (7) Acid Prep
      Solution of 10% $H_2SO_4$ at 100° F. (37.8° C.).
      Dip panel in solution with active agitation for 2 minutes.
   (8) Water Rinse
      Dip rinse with agitation in deionized water for 2 minutes (water temperature=100° F. (37.8° C.).)
      Spray rinse in deionized water for 2 minutes (water temperature=105° F. (40.5° C.)).
   (9) Prime
      MACuDizer TM 92 Primer solution at 110° F. (43.3° C.).
      Dip panel in solution with active agitation for 7 minutes.
   (10) Water Rinse
      Dip rinse with agitation in deionized water for 2 minutes (water temperature=105° F. (40.5° C.)).
      Spray rinse in deionized water for 2 minutes (water temperature=100° F. (37.8° C.).)
      MACuPrep TM Etch G-4 solution at 100° F. (37.8° C.).
      Dip panel in solution with active agitation for 1 minute.
   (11) Water Rinse
      Dip rinse with agitation in deionized water for 2 minutes (water temperature=100° F. (37.8° C.).)
      Spray rinse in deionized water for 2 minutes (water temperature=100° F. (37.8° C.).)
   (12) Acid Clear
      Solution of 10% $H_2SO_4$ at 100° F. (37.8° C.).

Dip panel in solution with active agitation for 2 minutes.

(13) Water Rinse
Dip rinse with agitation in deionized water for 2 minutes (water temperature=90° F. (32.2° C.).)
Spray rinse in deionized water for 2 minutes (water temperature=80° F. (26.7° C.)).

(14) Predip
MACuPrep ™ 93 Predip solution at 70° F. (21.1° C.).
Dip panel in solution with active agitation for 30 seconds.

(15) Activator
MACuPrep ™ 93 Predip solution at 70° F. (21.1° C.).
Dip panel in solution with active agitation for 45 seconds.

(16) Water Rinse
Dip rinse with agitation in deionized water for 2 minutes (water temperature=70° F. (21.1° C.).)

(17) Accelerator
MACuPrep ™ 97 Accelerator solution at 90° F. (32.2° C.).
Dip panel in solution with agitation for 2 minutes.

(18) Water Rinse
Dip rinse with agitation in deionized water for 2 minutes (water temperature=95 degree F. (35° C.)).
Spray rinse in deionized water for 2 minutes (water temperature=95° F. (35° C.)).

(19) Electroless Copper
MACuDep ™ 850 solution at 95° F. (35° C.).
Dip panel in solution with active agitation for 25 minutes.

(20) Water Rinse
Dip rinse with agitation in deionized water for 2 minutes (water temperature=95° F. (35° C.)).
Spray rinse in deionized water for 2 minutes (water temperature=95° F. (35° C.)).

(21) Anti-Tarnish
Metex ™ M-667 Anti-tarnish solution at 90° F. (32.2° C.).
Dip panel in solution with active agitation for 30 seconds.

(22) Water Rinse
Dip rinse with agitation in deionized water for 2 minutes (water temperature=95° F. (35° C.)).
Spray rinse in deionized water for 2 minutes (water temperature=95° F. (35° C.)).

(23) Dry
Dry panel with warm air dryer.

Mask Plating Pattern: The purpose of this series of steps is to mask the areas of the customer-defined board which will NOT have copper traces to prevent copper and tin/lead plating in areas which will occur in later steps. This step is known in the art.

(1) Laminate Resist
Laminate photoresist using hot roll laminator at 230-250° F. (110-121.1° C.).

(2) Cure Resist
Let sit at room temperature for 15 minutes.

(3) Expose Photo Resist
Expose for 3.5 minutes using the BTX-200 ultraviolet exposure unit.

(4) Post Cure Resist
Let sit at room temperature 15 minutes.

(5) Develop Exposed Pattern
Use DFD-12G developing solution.
Spray develop for 1.5 minutes.

(6) Water Spray Rinse
Dip rinse with agitation in deionized water for 2 minutes (water temperature=95° F. (35° C.)).
Spray rinse in deionized water for 2 minutes (water temperature=95° F. (35° C.)).

Pattern Plating. The purpose of this series of steps is to build up the copper thickness in the following areas:
Hole Walls
Copper Traces
After the copper has been built up, Tin/Lead is plated on top of the copper. This step is known in the art.

Process Steps (1) Chemically Clean Copper
Metex ™ 9268 cleaner solution at 90° F. (32.2° C.).
Dip panel in solution with active agitation for 30 seconds.

(2) Water Spray Rinse
Dip rinse with agitation in deionized water for 2 minutes (water temperature=95° F. (35° C.)).
Spray rinse in deionized water for 2 minutes (water temperature=95° F. (35° C.)).

(3) Prep Panel
MACuPrep ™ Etch G-4 solution at 100° F. (37.8° C.).
Dip panel in solution with active agitation for 1 minute.

(4) Water Spray Rinse
Dip rinse with agitation in deionized water for 2 minutes (water temperature=95° F. (35° C.)).
Spray rinse in deionized water for 2 minutes (water temperature=95° F. (35° C.)).

(5) Acid Treat Panel
Solution of 10% $H_2SO_4$ at 100° F. (37.8° C.).
Dip panel in solution with active agitation for 1 minute.

(6) Electroplate Copper
MACu SPEC ™ 9241 acid copper solution at 90° F. (32.2° C.).
Dip panel in electroplating solution with active agitation and plating for 36 minutes (7) Water Spray Rinse
Dip rinse with agitation in deionized water for 2 minutes (water temperature=95° F. (35° C.)).
Spray rinse in deionized water for 2 minutes (water temperature=95° F. (35° C.)).

(8) Clean Copper
Fluroboric acid at 100° F. (37.8° C.).
Dip panel in solution with active agitation for 1 minute.

(9) Electroplate Tin/Lead
TARTAN ™ Sn-Pb Plating solution at 90° F. (32.2° C.).
Dip panel in electroplating solution with active agitation and plating for 36 minutes.

(10) Water Spray Rinse
Dip rinse with agitation in deionized water for 2 minutes (water temperature=95° F. (35° C.)).
Spray rinse in deionized water for 2 minutes (water temperature=95° F. (35° C.)).

(11) Dry Panel
Dry panel with warm air dryer.

Strip and Etch: The purpose of this series of steps is to remove any unwanted copper from the top and bottom layers of the board. This step is known in the art.

(1) Strip Resist Pattern

Use DFS-12G resist stripper solution at 95° F. (35° C.).

Dip process panel in tank with agitation for 6 minutes. After processing ensure that all traces of photoresist are gone before proceeding to the next step.

(2) Water Spray Rinse

Dip rinse with agitation in deionized water for 2 minutes (water temperature=95° F. (35° C.)).

Spray rinse in deionized water for 2 minutes (water temperature=95° F. (35° C.)).

(3) Etch Panel

SP-20 Etching solution at 95° F.

Dip panel in solution with active agitation for 1 minute.

(4) Water Spray Rinse

Dip rinse with agitation in deionized water for 2 minutes (water temperature=95° F. (35° C.)).

Spray rinse in deionized water for 2 minutes (water temperature=95° F. (35° C.)).

(5) Dry Panel

Dry panel with warm air dryer.

PRODUCT EVALUATION AND FINAL QUALITY CONTROL STEP 74. Perform the following steps to ensure that the correction factors are still current, and that all process steps are within tolerance:

Three dimensional X-ray Test: To ensure that current correction factors are still valid.

Electrical Test: To ensure that the board has come through all processing steps correctly.

The final product is depicted in FIG. 15. FIG. 15 shows a double-sided printed circuit board 180, having two layers of conductive copper 180 and 186, separated by a layer of insulative material 184. Also depicted in FIG. 15 are some representative conductive paths 188.

Figure 16:
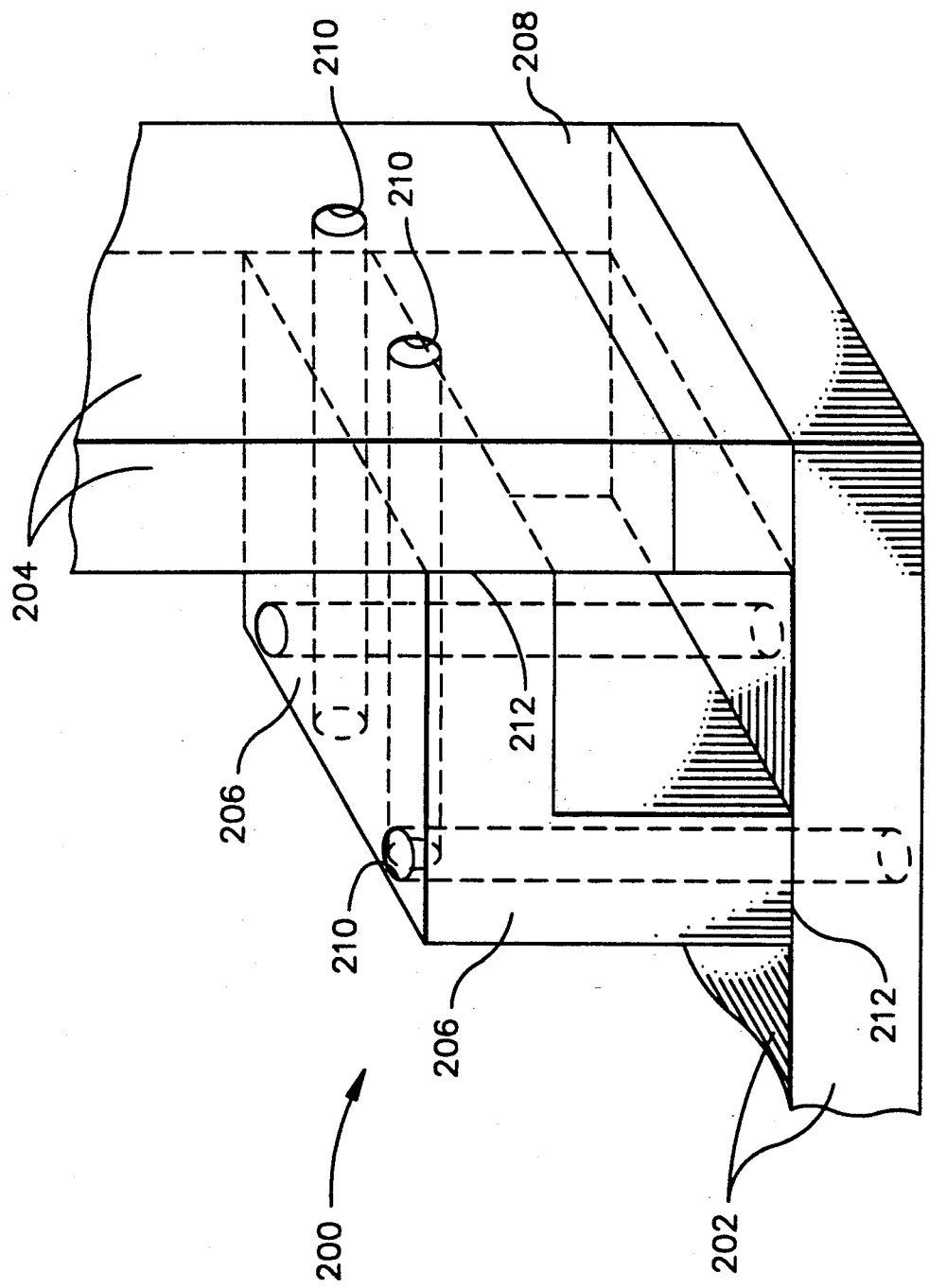
FIG. 16 is an isometric view of a flexible coaxial equivalent connector made in accordance with the present invention.

FLEXIBLE COAXIAL EQUIVALENT CONNECTOR. In order to connect two printed circuit boards which are made in accordance with the present invention, one of the printed circuit boards must be able to plug into a second similar board. Such an arrangement is depicted in FIG. 16, where a flexible coaxial equivalent connector is indicated by the numeral 200. In FIG. 16, the mother board 202 is a multi-layer printed circuit board, and it receives a plug-in module 204, which also is a multi-layer printed circuit board. Plug-in module 204 does not, however, have an edge of conductive parallel fingers, as is done in the prior art. Accordingly, the mother board 202 does not contain a typical prior art edge connector, as seen in many computer mother boards. Plug-in module 204 does make direct electrical connection to the mother board 202, however, it is only the ground conductors which are connected between the two boards 204 and 202. Such ground connection is made through a conductive gasket 208.

The conductive gasket 208 is attached to the plug-in module 204 by adhesive, and consists of a compressible rubber-like material which is electrically conductive. Such electrically conductive material connects the ground plane of the plug-in board 204 to the ground plane of the mother board 202. No signals pass through the conductive gasket 208.

To connect the signals of the plug-in module 204 to the mother board 202, a right-angle conductive shell 206 is used. In order to hold the right-angle conductive shell 206 to both the mother board 202 and the plug-in module 204, standard bolts are used, being run through the bolt holes 210. The right-angle conductive shell has coaxial cable equivalents or tuned wave guide equivalents within its circuitry. In essence, the right-angle conductive shell 206 is a miniature printed circuit board.

Figure 17:
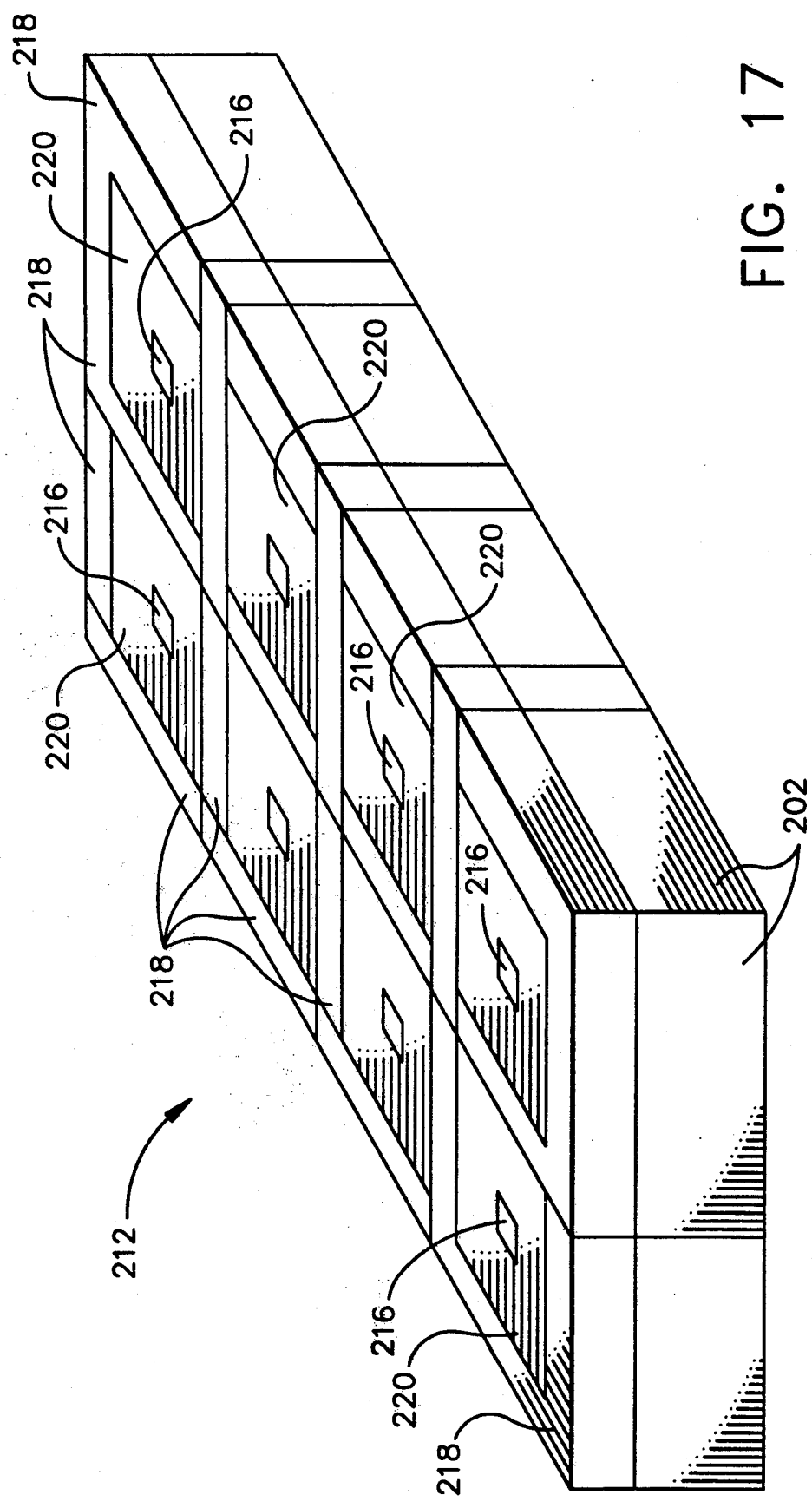
FIG. 17 is an isometric view of a receiving area for mating with flexible coaxial equivalent connectors made in accordance with the present invention.

The signals which pass through the right-angle conductive shell 206 mate from the right-angle conductive shell 206 into either the mother board 202 or the plug-in module 204 via a receiving area of coaxial connectors 212. The receiving area is depicted on FIG. 17, and shows, in the illustrated embodiment, a total of eight coaxial connectors. In FIG. 17, the receiving area 212 is depicted as lying on the surface of the mother board 202, however, it is obvious that a second receiving area 212 would also exist on the plug-in module 204. Each of the eight coaxial connectors has a square inner conductor 216, and a square outer conductor 218, which are separated by insulative material 220. It is obvious that the right-angle conductive shell 206 must contain electrically conductive paths which mate dimensionally to the receiving area of coaxial connectors 212.

FIG. 18 depicts, again, the flexible coaxial equivalent connector 200, but also gives some details of the inner pieces of the right-angle conductive shell 206. One important detail is the fact that right angle conductive shell 206 consists of what is known in the prior art as rigid flex-board. Rigid flex-board comprises regular rigid printed circuit board, typically made out of epoxy resin mixed in with fiberglass fibers, plus a portion of flexible printed circuit board. The flexible portion of the printed circuit board is embedded at the ends of the rigid board, in a configuration whereby the flexible portion sticks out past the end portion of the rigid board.

Right-angle conductive shell 206 also comprises the rigid flex-board construction known in the prior art. As can be seen in FIG. 18, a portion of flexible material 226 makes up the ends of the right-angle conductive shell 206. This is important so as to maintain a good, solid electrical connection between the mother board 202 and the right-angle conductive shell 206, while at the same time, insuring structural integrity for the life of the product. The bolt holes 210 are formed all the way through the right-angle conductive shell 206, including both the rigid and the flexible portions.

FIG. 18 depicts both vertical and horizontal conductive paths within the right-angle conductive shell 206. Vertical square inner conductive paths 222 are shown as running from the mother board 202, at the receiving area of coaxial connectors 212, up to the point where the conductive path makes a right angle and becomes a horizontal square inner conductive path 224. Once the path becomes horizontal, it continues all the way until it meets the receiving area of coaxial connectors 212 which resides on the plug-in module 204. In this way, the inner conductors of coaxial cable equivalents which reside on the mother board 202 are electrically connected to similar inner conductors of coaxial cable equivalents on the plug-in module 204. It is obvious that square outer conductors will also travel a similar path from the receiving area of coaxial connectors 212 which is on the mother board 202 vertically through the right-angle conductive shell 206, making a right-angle turn and then travelling horizontally until it meets the receiving area of coaxial connectors 212, which resides on the plug-in module 204. The square outer connectors are not shown on FIG. 18, however, it is obvious that they would be individually configured to surround the square inner conductors 222 and 224.

FIGS. 17 and 18 depict square inner and outer conductors for the coaxial cable equivalents which reside within the right-angle conductive shell 206. It is obvious that round inner and outer conductors can also be made to reside within the right-angle conductive shell using the procedures disclosed within the present invention.

In summary, numerous benefits have been described which result from employing the concepts of the invention. A method for making printed circuit boards discloses a procedure for making both multi-layer and double-sided printed circuit boards. The method for making multi-layer printed circuit boards provides an improved multi-layer printed circuit board which cannot be made according to current process technologies, the disclosed method enabling a greater number of layers than has been achieved in the past along with greater accuracy in the locating of conductive paths upon each layer. By use of a standard test pattern, such test pattern being used to create double-sided and three-layer test boards, the art work can be automatically adjusted in one of the method steps to compensate for any deviations in the processing of the actual test boards. Once the necessary art work adjustments have been determined, the customer's art work can be integrated with such adjustments and used to make final production printed circuit boards having art work which will represent the customer's needs. The disclosed method for making multi-layer printed circuit boards also provides a process for manufacturing high density coaxial cable equivalents and tuned wave guide equivalents within the multi-layer board. The method discloses the process for making both square equivalents and round equivalents of such coaxial cable and wave guides. The method also discloses the necessary flexible connectors to allow a backplane printed circuit board to receive a plug-in printed circuit board module while still maintaining the coaxial cable equivalent or wave guide equivalent throughout.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

I claim:

1. A method for manufacturing high-precision multi-layer printed circuit boards having predetermined custom artwork data on a predefined working area, said method comprising the following steps:
   (a) grading printed circuit board raw material said grading step further comprising the following steps:
      (i) creating a plurality of double-sided printed circuit boards using a standard conductive path test pattern from a particular material batch number and same manufacturing lot number;
      (ii) creating at least one three-dimensional X-ray image of each of said double-sided printed circuit boards;
      (iii) computing basic correction factors by comparing the X-ray image to a standard template;
      (iv) using the computed basic correction factors to create at least one test multi-layer printed circuit board test piece using material from said particular material batch number and manufacturing lot number;
      (v) creating a three-dimensional X-ray image of said multi-layer printed circuit board test piece;
      (vi) measuring the X and Y axis drift of said test piece;
      (vii) measuring the Z axis shift of said test piece;
      (viii) measuring the X, Y and Z axis quiver of said test piece;
      (ix) computing correction factors for circuit boards made from said particular material batch number and manufacturing lot number;
   (b) implementing artwork computation and adjustments, wherein said basic correction factors are used to make changes to desired custom artwork digitized data in order to account for the variations encountered in said test piece, said changes in the custom artwork digitized data providing the necessary correction factors for use with the particular batch;
   (c) processing of inner layers of said high-precision printed circuit boards, said processing step, further comprising the following steps:
      (i) drilling tooling and registration holes in said inner layer printed circuit board, said holes falling outside the predefined working area;
      (ii) masking first areas of said inner layer printed circuit board which will not have conductive traces in order to prevent conductive plating in said first areas, leaving unmasked second areas of said printed circuit board which will have conductive traces;
      (iii) pattern plating said inner layer printed circuit board in order to build up the thickness of said conductive traces;
      (iv) stripping and etching said inner layer printed circuit board as necessary to remove unwanted conductive material from the conductive layers on the inner layer printed circuit board;
   (d) evaluating the processed inner layers, wherein said inner layer printed circuit board is subjected to a three-dimensional X-ray test in order to ensure that said correction factors are valid, and an electrical test to ensure that each inner layer printed circuit board provides correct electrical circuitry;
   (e) laminating said inner layer printed circuit boards in proper order and using the correction factors which have been computed for the particular material batch, thus creating a laminated printed circuit board;
   (f) processing of outer layers high-precision printed circuit boards, this processing step further comprising the following steps:
      (i) drilling said laminated printed circuit board according to a desired pattern of holes;
      (ii) depositing of conductive material on said outer layers, wherein the interior walls of said holes are plated with conductive material, in order to allow electrical signals to travel from conductive top outer layer, to the conductive bottom outer layer, and to allow electrical signals to travel from the said outer layers to desired said inner layer printed circuit boards;

(iii) masking third areas of said laminated printed circuit board which will not have conductive traces in order to prevent conductive plating in said third areas, leaving unmasked fourth areas of said printed circuit board which will have conductive copper traces;

(iv) pattern plating said laminated printed circuit board in order to build up the thickness of the conductive material in the interior of said hole walls and said conductive traces;

(v) stripping and etching said laminated printed circuit board in order to remove unwanted conductive material from the top and bottom layers of the laminated printed circuit board;

(g) evaluating the outer layers, wherein said laminated printed circuit board is subjected to a three-dimensional X-ray test in order to ensure that said correction factors are valid, and an electrical test to ensure that said laminated printed circuit board provides correct electrical circuitry; and (h) completing final quality evaluation of the resulting multi-layered circuit board.

2. The method for manufacturing high-precision multi-layer printed circuit boards of claim 1, further comprising the step of ordering and receiving material, wherein said printed circuit board raw material is ordered and received with particular attention being paid to the batch and lot numbers, and said materials are grouped according to their specific batch and lot numbers.

3. The method for manufacturing high-precision multi-layer printed circuit boards of claim 1, further comprising the step of storing material in short-term storage, wherein said printed circuit board raw material is received into a standard holding area to allow said material to achieve proper temperature and humidity conditions.

4. The method for manufacturing high-precision multi-layer printed circuit boards of claim 1, further comprising the step of storing material in long-term storage, wherein said printed circuit board raw material is stored under constant temperature and humidity conditions to insure that said material remains stable.

5. The method for manufacturing high-precision multi-layer printed circuit boards of claim 1, further comprising the step of selecting material, wherein said printed circuit production material is selected based on one or more characteristics, such characteristics comprising material type, material thickness, copper thickness, total board thickness, and material grading data, such material grading data comprising X and Y axis drift, Z axis shift, and X, Y and Z axis quiver.

6. The method for manufacturing high-precision multi-layer printed circuit boards of claim 1, further comprising the following steps:

(a) ordering and receiving material, wherein said printed circuit board raw material is ordered and received with particular attention paid to the batch and lot numbers, and said materials are grouped according to their specific batch and lot numbers;

(b) storing material in short-term storage, wherein said printed circuit board raw material is received into a standard holding area to allow said material to achieve proper temperature and humidity conditions;

(c) storing material in long-term storage, wherein said printed circuit board raw material is stored under constant temperature and humidity conditions to insure that said material remains stable; and (d) selecting material for processing, based on one or more characteristics, such characteristics comprising material type, material thickness, copper thickness, total board thickness, and material grading data, such material grading data comprising X and Y axis drift, Z axis shift, and X, Y and Z axis quiver.

7. The method for manufacturing high-precision multi-layer printed circuit boards of claim 1, further comprising the following steps of processing of inner layers:

(a) stacking up said inner layer printed circuit boards into three layers of conductive material and laminating said stack-up, thus creating a laminated three-layer board;

(b) milling and drilling said laminated three-layer board according to custom requirements, thus creating vertical and horizontal slots and holes;

(c) plating said laminated three-layer board with conductive material;

(d) back-filling said laminated three-layer board;

(e) curing said back-filled laminated three-layer board;

(f) further processing of inner layers of said printed circuit board, comprising the following steps:

(i) masking fifth areas of said laminated three-layer board which will not have conductive traces in order to prevent conductive plating in said fifth areas, leaving unmasked sixth areas of said printed circuit board which will have conductive traces;

(ii) pattern plating said laminated three-layer board in order to build up the thickness of said conductive traces;

(iii) stripping and etching said laminated three-layer board in order to remove unwanted conductive material from the laminate; and (iv) etching the outer layers of said laminated three-layer board.

8. The method for manufacturing high-precision multi-layer printed circuit boards of claim 7, further comprising the following steps of lamination:

(a) laminating individual stacks of said laminated three-layer board as necessary thus creating a sub-stack of laminated multi-layer board;

(b) milling and drilling said sub-stack of laminated multi-layer board as desired, thus creating vertical and horizontal slots and holes;

(c) plating said sub-stack of laminated multi-layer board;

(d) back-filling said vertical and horizontal slots and holes of said sub-stack of laminated multi-layer board;

(e) curing said backfilled laminated multi-layer board; and (f) further processing of inner layers comprising the following steps:

(i) masking seventh areas of said sub-stack of laminated multi-layer board which will not have conductive traces in order to prevent conductive plating in said seventh areas, leaving unmasked eighth areas of said printed circuit board which will have conductive traces;

(ii) pattern plating said sub-stack of laminated multi-layer board in order to build up the thickness of said conductive traces;

(iii) stripping and etching said sub-stack of laminated multi-layer board in order to remove any unwanted conductive material from the laminate; and (iv) etching the outer layers of said sub-stacked laminated multi-layer board.

9. The method for manufacturing high-precision printed circuit boards of claim 1, wherein said laminated printed circuit board has conductive traces that are 0.0127 mm or greater in width, and said conductive traces are spaced apart by 0.0127 mm or greater.

10. The method for manufacturing high-precision printed circuit boards of claim 6, wherein said laminated printed circuit board has conductive traces that are 0.0127 mm or greater in width, and said conductive traces are spaced apart by 0.0127 mm or greater.

11. A method for manufacturing high-precision double-sided printed circuit boards having custom artwork data on a predefined working area, said method comprising the following steps:

(a) grading printed circuit board raw material, said grading step further comprising:
 (i) creating double-sided printed circuit boards test pieces using a standard conductive path test pattern template, and made of material from a particular batch number and manufacturing lot number;
 (ii) creating at least one three-dimensional X-ray image of each of said test pieces;
 (iii) measuring the X and Y axis drift of each test piece;
 (iv) measuring the Z axis shift of each test piece;
 (v) measuring the X, Y and Z axis quiver of each test piece;
 (vi) computing correction factors necessary to correct any measured drift, shift and quiver;

(b) implementing artwork adjustments, wherein said correction factors are used to make changes in the custom printed circuit artwork digitized data in order to account for variations encountered in said test pieces, said correction factors providing the necessary adjustments for use with the particular batch of said material and processing equipment for the finished printed circuit board product to be made;

(c) processing a finished double-sided board having custom artwork data, said processing further comprising the following steps:
 (i) drilling said finished double-sided Printed circuit board according to a desired hole pattern;
 (ii) depositing of conductive material on said finished double-sided printed circuit board, wherein the interior walls of said holes are plated in order to allow electrical signals to travel from the conductive top to the conductive bottom of said finished double-sided board;
 (iii) masking first areas of said finished double-sided printed circuit board which are not to have conductive traces, and leaving unmasked second areas of said printed circuit board which are to have conductive traces;
 (iv) pattern plating said finished double-sided printed circuit board in order to build up the thickness of conductive material in the interior of said hole walls and said conductive traces;
 (v) stripping and etching said finished double-sided printed circuit board as required to remove unwanted conductive material from the top and bottom layers of the printed circuit board; and (d) evaluating said finished double-sided board, wherein the printed circuit board is subjected to a three-dimensional X-ray test in order to ensure that said correction factors are valid, and an electrical test to ensure that the printed circuit board provides correct electrical circuitry.

12. The method for manufacturing high-precision double-sided printed circuit boards of claim 11, further comprising the step of ordering and receiving material, wherein said printed circuit board raw material is ordered and received with particular attention being paid to the batch and lot numbers, and said materials are grouped according to their specific batch and lot numbers.

13. The method for manufacturing high-precision double-sided printed circuit boards of claim 11, further comprising the step of storing material in short-term storage, wherein said printed circuit board raw material is received into a standard holding area to allow said material to achieve proper temperature and humidity conditions.

14. The method for manufacturing high-precision double-sided printed circuit boards of claim 11, further comprising the step of storing material in long-term storage, wherein said printed circuit board raw material is stored under constant temperature and humidity conditions to insure that said material remains stable.

15. The method for manufacturing high-precision double-sided printed circuit boards of claim 11, further comprising the step of selecting material, wherein said printed circuit production material is selected based on one or more characteristics, such characteristics comprising material type, material thickness, copper thickness, total board thickness, and material grading data, such material grading data comprising X and Y axis drift, Z axis shift, and X, Y and Z axis quiver.

16. The method for manufacturing high-precision double-sided printed circuit boards of claim 11, further comprising the following steps:
(a) ordering and receiving material, wherein said printed circuit board raw material is ordered and received with particular attention paid to the batch and lot numbers, and said materials are grouped according to their specific batch and lot numbers;
(b) storing material in short-term storage, wherein said printed circuit board raw material is received into a standard holding area to allow said material to achieve proper temperature and humidity conditions;
(c) storing material in long-term storage, wherein said printed circuit board raw material is stored under constant temperature and humidity conditions to insure that said material remains stable; and
(d) selecting material for processing, based on one or more characteristics, such characteristics comprising material type, material thickness, copper thickness, total board thickness, and material grading data, such material grading data comprising X and Y axis drift, Z axis shift, and X, Y and Z axis quiver.

17. The method for manufacturing high-precision double-sided printed circuit boards of claim 11, wherein said finished double-sided board has conductive traces that are 0.0127 mm or greater in width, and said conductive traces are spaced apart by 0.0127 mm or greater.

18. The method for manufacturing high-precision double-sided printed circuit boards of claim 16, wherein said customer-defined double-sided board has conductive traces that are 0.0127 mm or greater in width, and said conductive traces are spaced apart by 0.0127 mm or greater.

* * * * *

UNITED STATES PATENT AND TRADEMARK OFFICE
CERTIFICATE OF CORRECTION

PATENT NO. : 5,196,087
DATED : March 23, 1993
INVENTOR(S) : Robert Q. Kerns

It is certified that error appears in the above-indentified patent and that said Letters Patent is hereby corrected as shown below:

Claim 1, column 32, line 56, --of said-- should be inserted after "layers".

Signed and Sealed this

Fourth Day of January, 1994

*Attest:*

BRUCE LEHMAN

*Attesting Officer*     *Commissioner of Patents and Trademarks*